(12) United States Patent
Busnaina et al.

(10) Patent No.: US 10,208,394 B2
(45) Date of Patent: Feb. 19, 2019

(54) DAMASCENE TEMPLATE FOR DIRECTED ASSEMBLY AND TRANSFER OF NANOELEMENTS

(71) Applicant: Northeastern University, Boston, MA (US)

(72) Inventors: Ahmed Busnaina, Needham, MA (US); Hanchul Cho, Gyeonggi-do (KR); Sivasubramanian Somu, Natick, MA (US); Jun Huang, Malden, MA (US)

(73) Assignee: Northeastern University, Boston, MA (US)

( * ) Notice: Subject to any disclaimer, the term of this patent is extended or adjusted under 35 U.S.C. 154(b) by 189 days.

(21) Appl. No.: 15/180,262

(22) Filed: Jun. 13, 2016

(65) Prior Publication Data
US 2017/0009365 A1    Jan. 12, 2017

Related U.S. Application Data

(62) Division of application No. 14/356,328, filed as application No. PCT/US2012/064176 on Nov. 8, 2012, now Pat. No. 9,365,946.

(Continued)

(51) Int. Cl.
*C25D 13/02* (2006.01)
*C25D 15/00* (2006.01)
(Continued)

(52) U.S. Cl.
CPC .............. *C25D 13/02* (2013.01); *B82Y 10/00* (2013.01); *B82Y 40/00* (2013.01); *C25D 13/00* (2013.01);
(Continued)

(58) Field of Classification Search
None
See application file for complete search history.

(56) References Cited

U.S. PATENT DOCUMENTS

| 2009/0087622 A1* | 4/2009 | Busnaina | B81C 1/00031 |
| | | | 428/173 |
| 2009/0134033 A1* | 5/2009 | Mead | C25B 7/00 |
| | | | 205/78 |

(Continued)

*Primary Examiner* — Kishor Mayekar
(74) *Attorney, Agent, or Firm* — Posternak, Blankstein & Lund LLP

(57) ABSTRACT

Damascene templates have two-dimensionally patterned raised metal features disposed on an underlying conductive layer extending across a substrate. The templates are topographically flat overall, and the patterned conductive features establish micron-scale and nanometer-scale patterns for the assembly of nanoelements into nanoscale circuits and sensors. The templates are made using microfabrication techniques together with chemical mechanical polishing. These templates are compatible with various directed assembly techniques, including electrophoresis, and offer essentially 100% efficient assembly and transfer of nanoelements in a continuous operation cycle. The templates can be repeatedly used for transfer of patterned nanoelements thousands of times with minimal or no damage, and the transfer process involves no intermediate processes between cycles. The assembly and transfer processes employed are carried out at room temperature and pressure and are thus amenable to low cost, high-rate device production.

9 Claims, 28 Drawing Sheets

Related U.S. Application Data

(60) Provisional application No. 61/556,904, filed on Nov. 8, 2011, provisional application No. 61/557,594, filed on Nov. 9, 2011.

(51) Int. Cl.
| | |
|---|---|
| *B82Y 10/00* | (2011.01) |
| *C25D 13/00* | (2006.01) |
| *B82Y 40/00* | (2011.01) |
| *G03F 7/00* | (2006.01) |
| *B82B 3/00* | (2006.01) |

(52) U.S. Cl.
CPC ........... *C25D 15/00* (2013.01); *G03F 7/0002* (2013.01); *B82B 3/0042* (2013.01); *Y10S 977/882* (2013.01)

(56) References Cited

U.S. PATENT DOCUMENTS

| | | | | |
|---|---|---|---|---|
| 2010/0183844 A1* | 7/2010 | Xiong | .................... | B82Y 10/00 428/156 |
| 2012/0326310 A1* | 12/2012 | Busnaina | ............ | H01L 21/2885 257/746 |
| 2013/0256013 A1* | 10/2013 | Sirman | .................. | B82Y 40/00 174/257 |

* cited by examiner

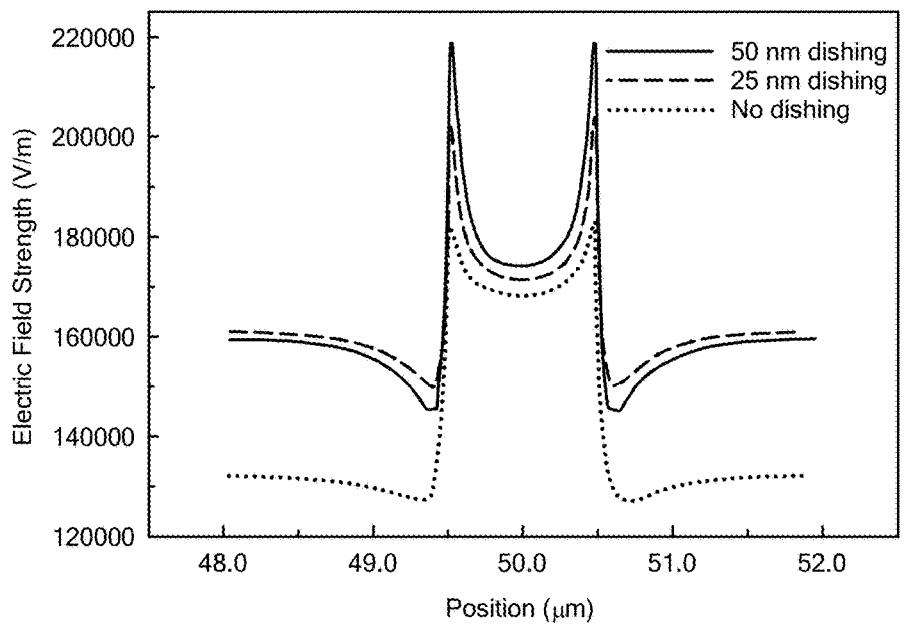
*FIG. 1C.1*
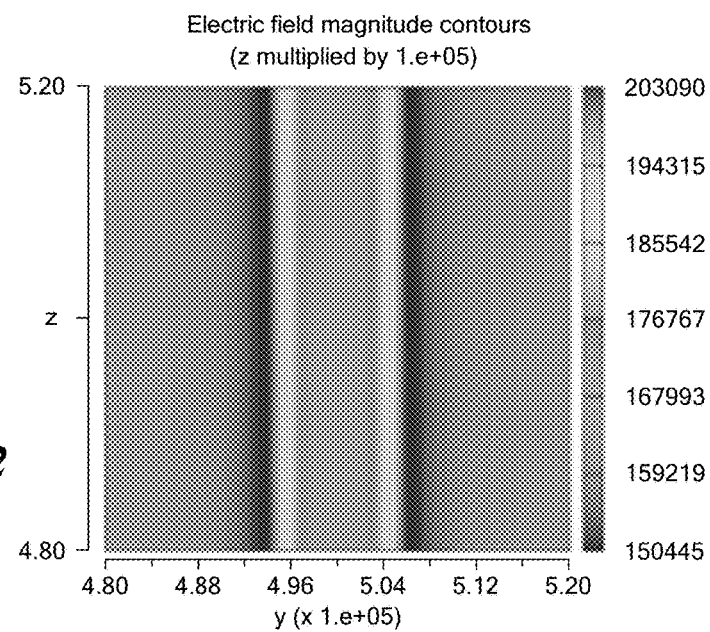
*FIG. 1C.2*

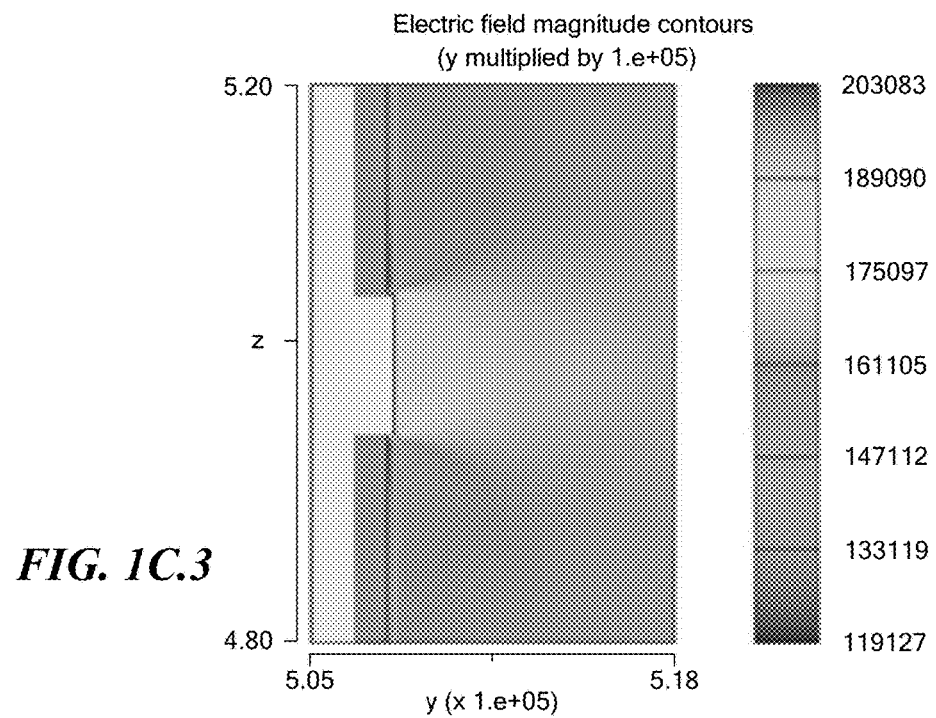
FIG. 1C.3
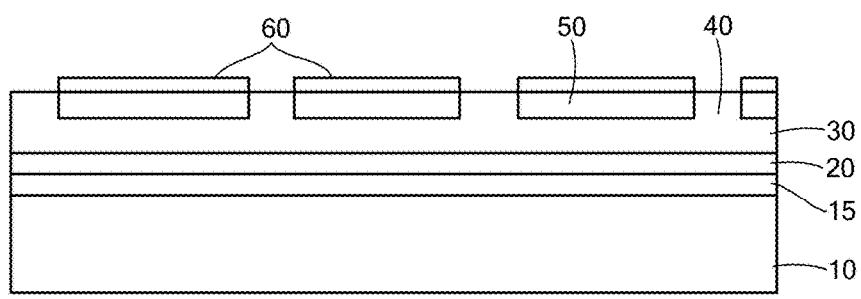
FIG. 1D

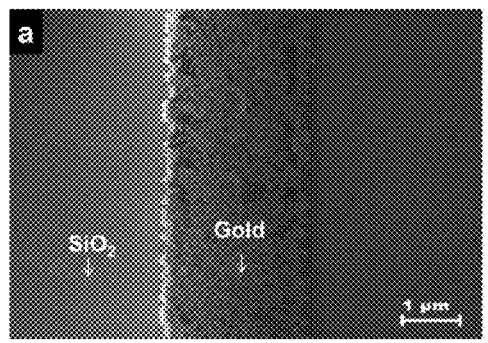
*FIG. 4A*
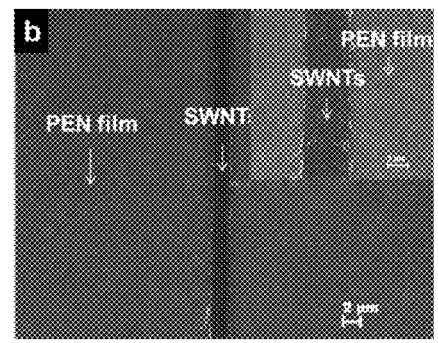
*FIG. 4B*
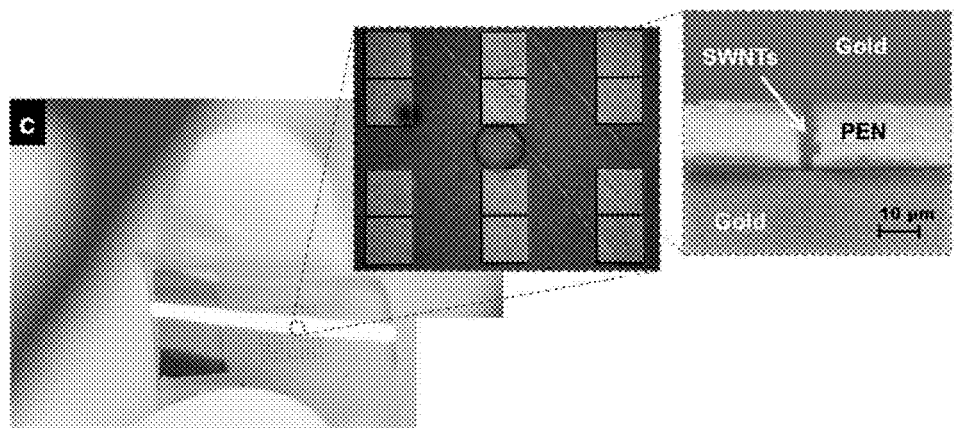
*FIG. 4C.1*
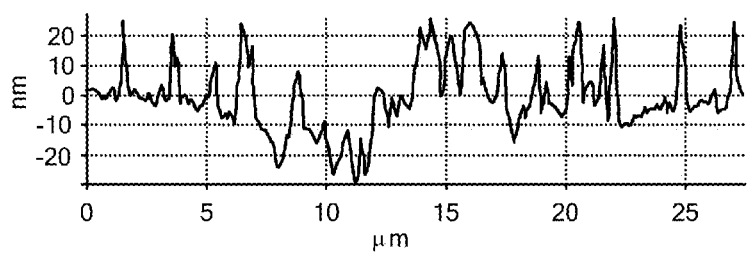
*FIG. 4C.2*

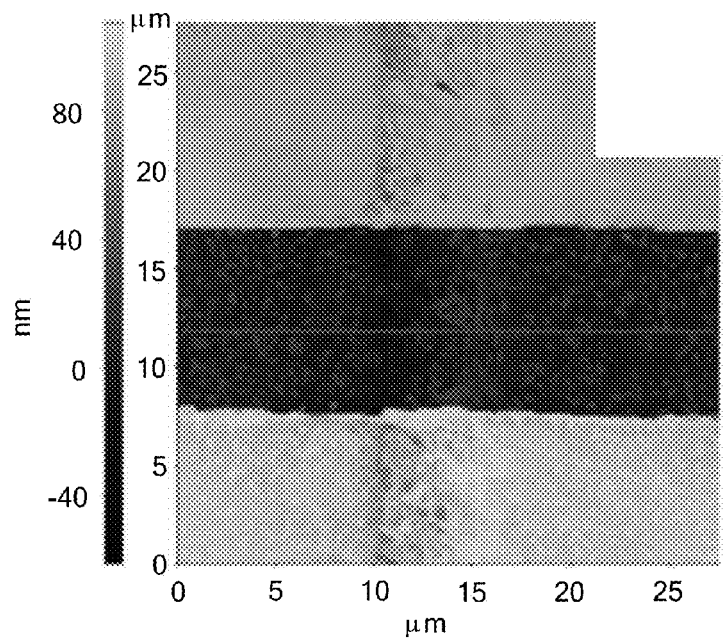
*FIG. 4C.3*
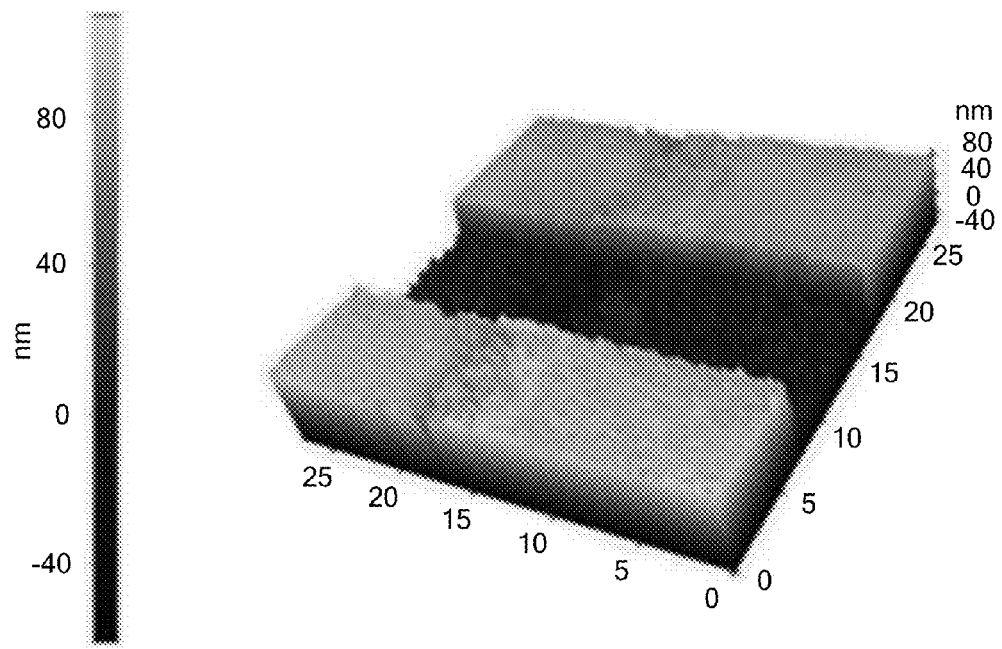
*FIG. 4C.4*

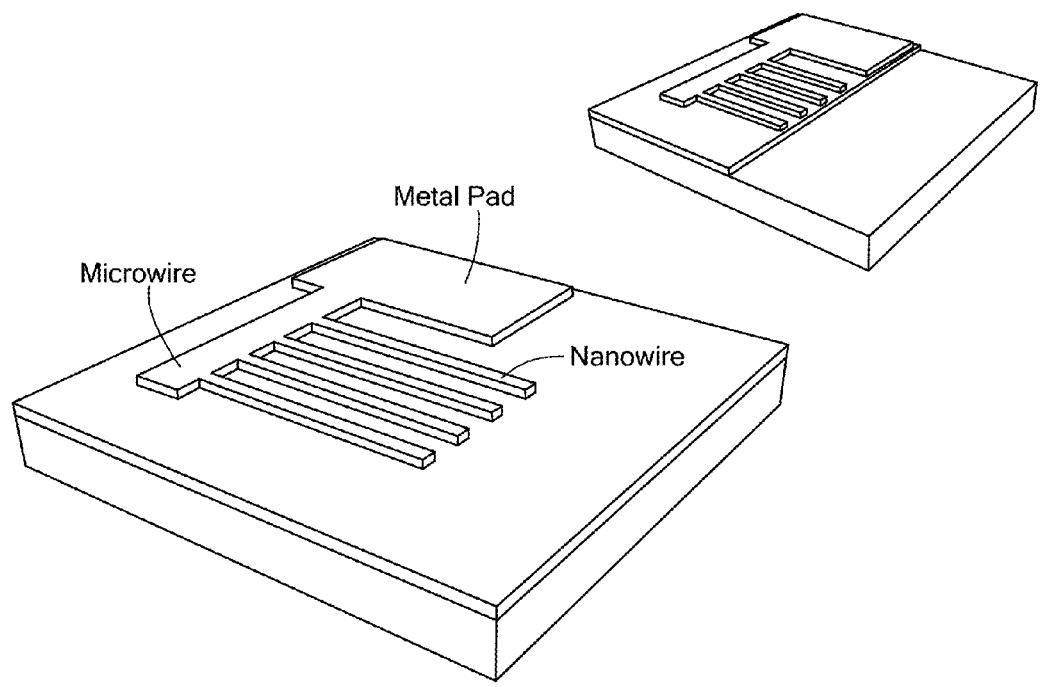
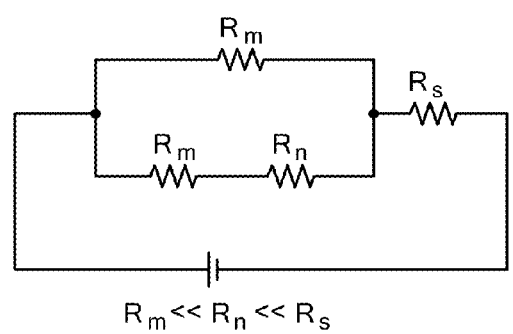
$R_m \ll R_n \ll R_s$
FIG. 5A

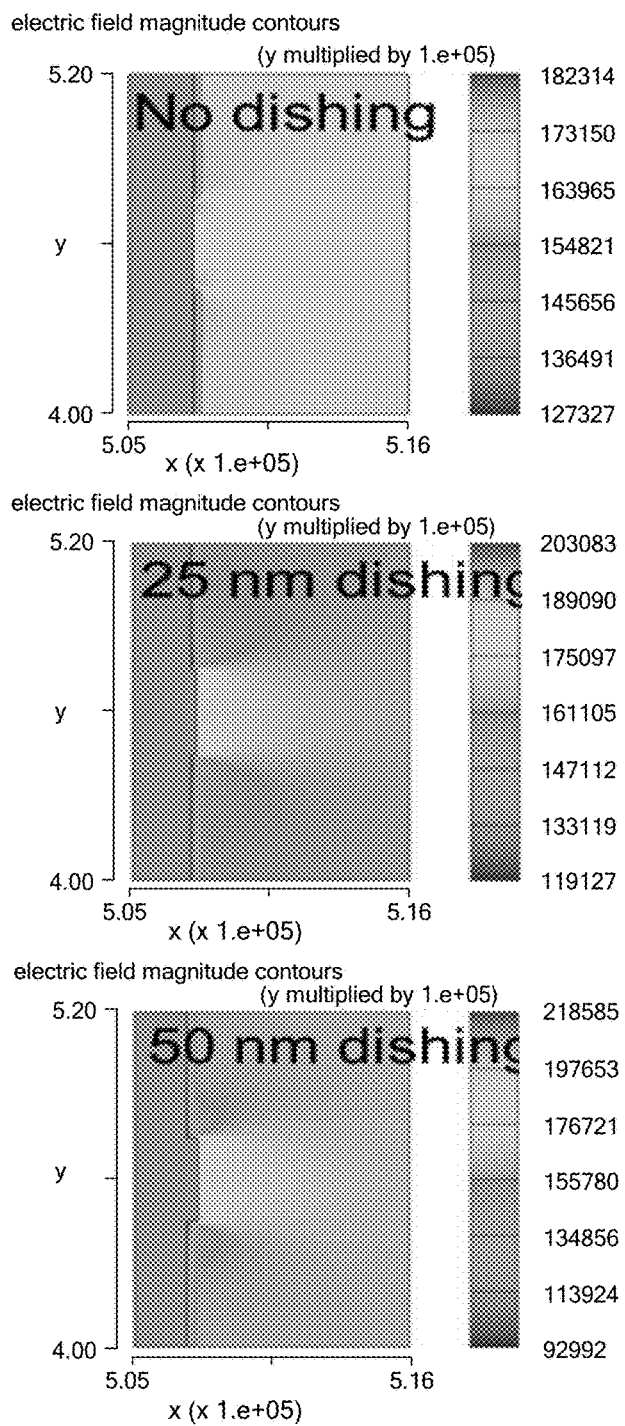
FIG. 6A.1

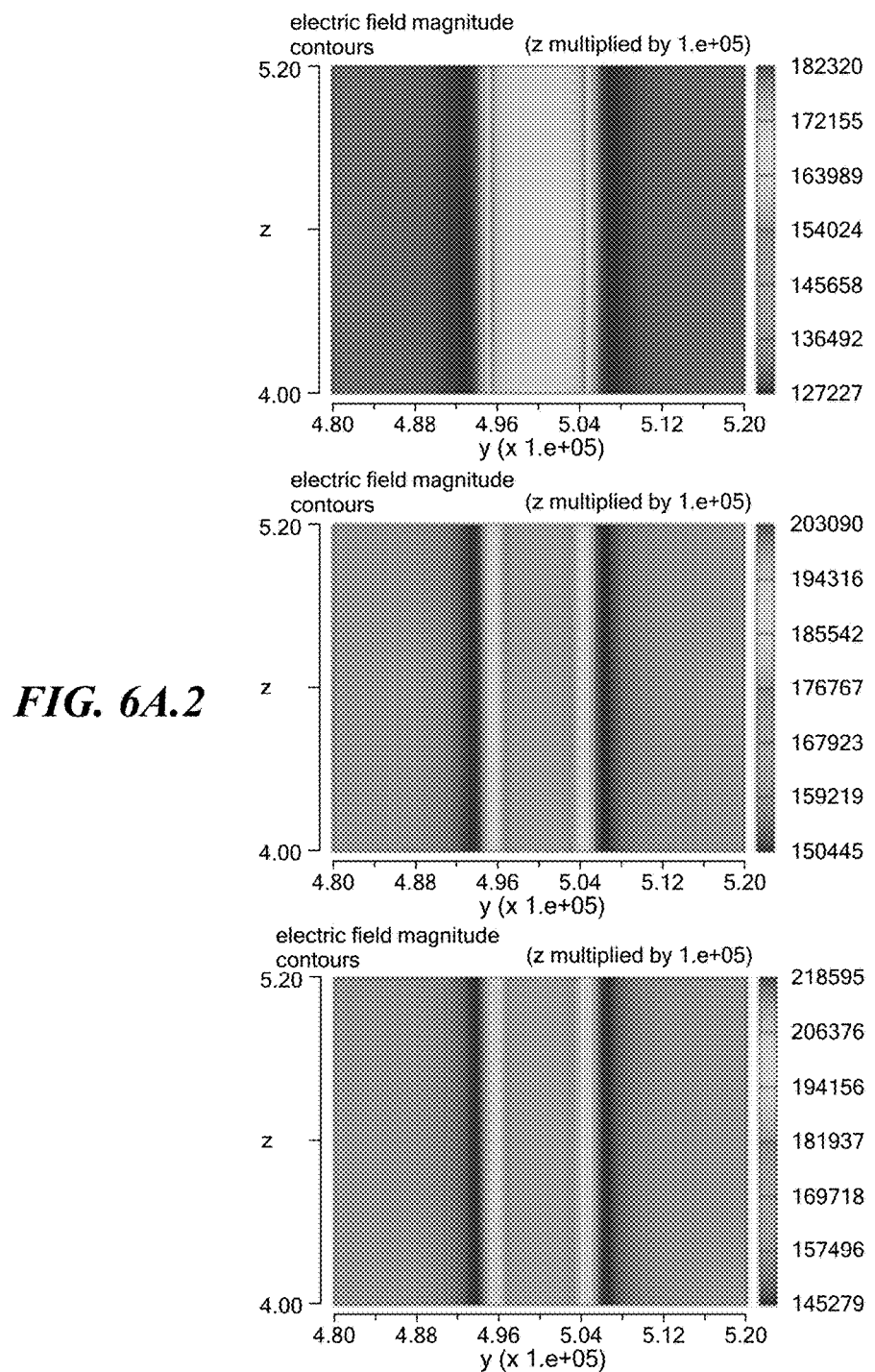
FIG. 6A.2

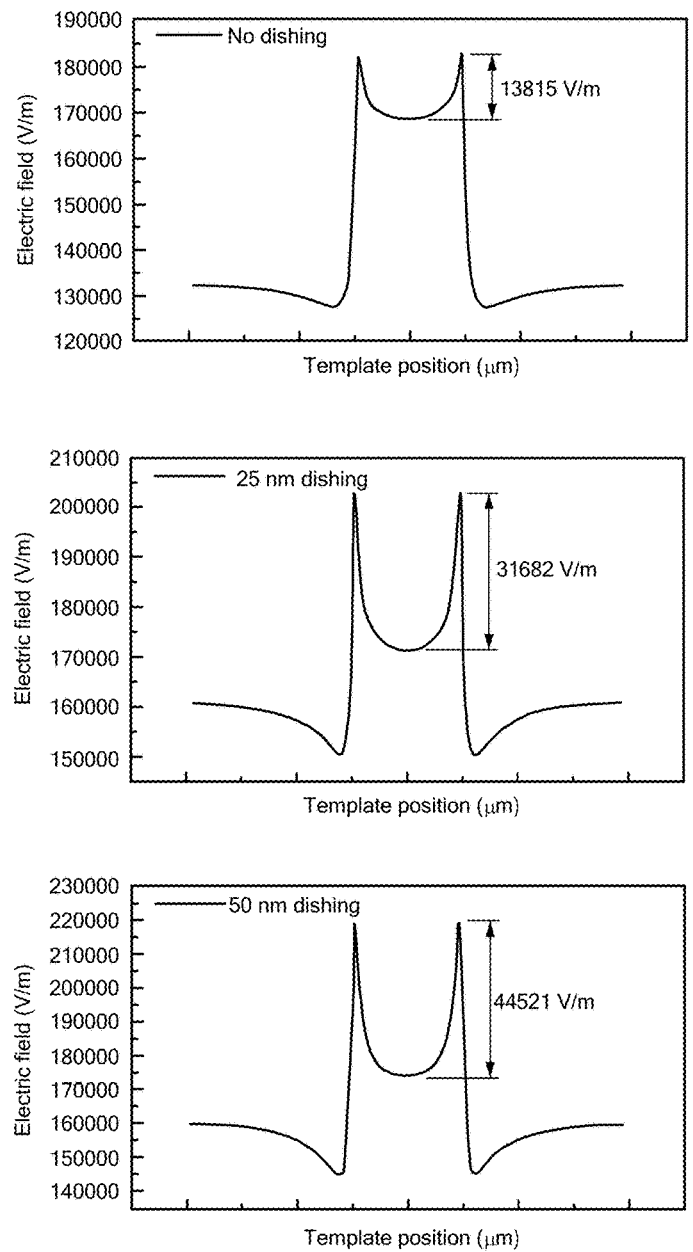
FIG. 6A.3

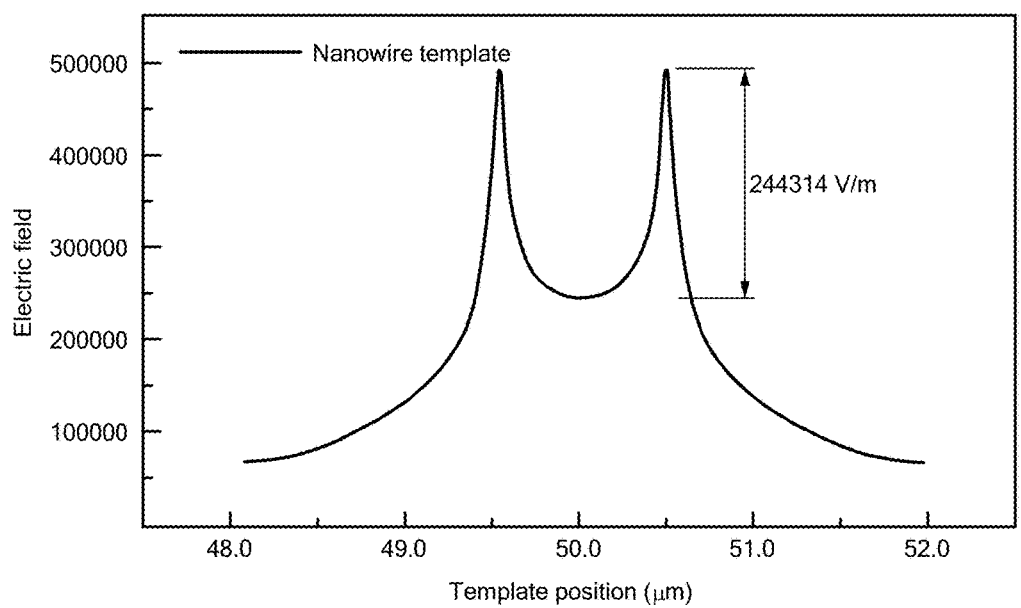
*FIG. 6B.1*

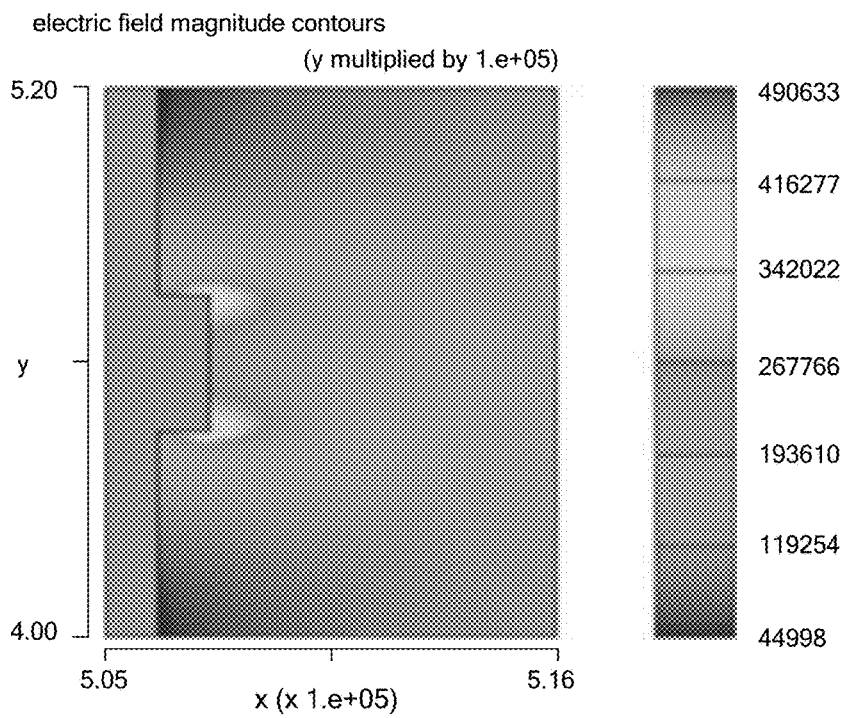
*FIG. 6B.2*
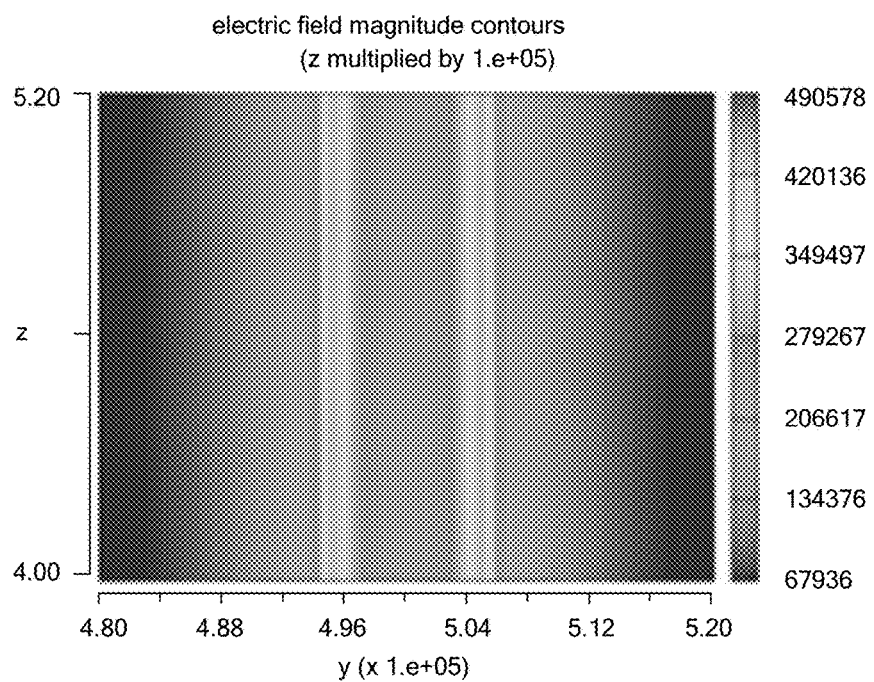
*FIG. 6B.3*

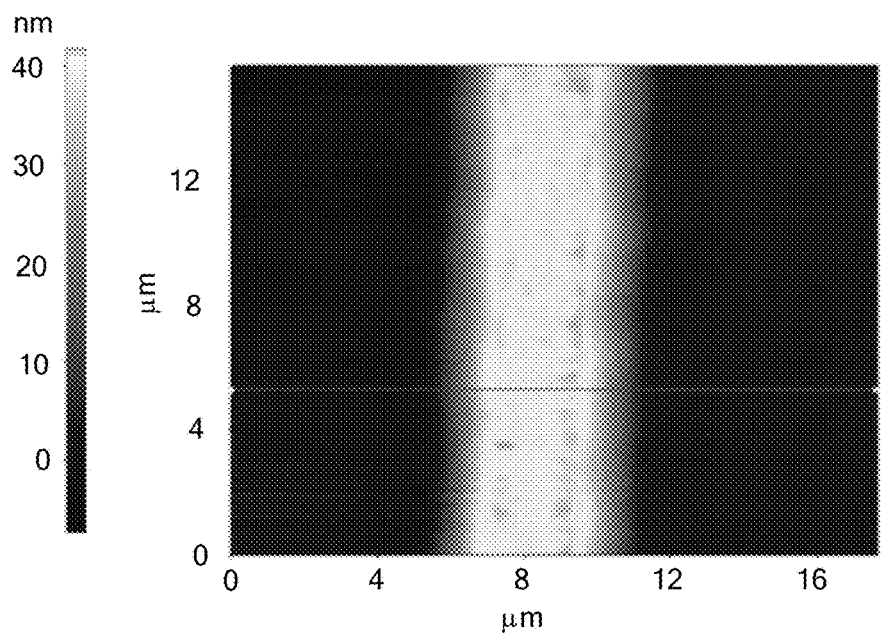
*FIG. 7A.1*
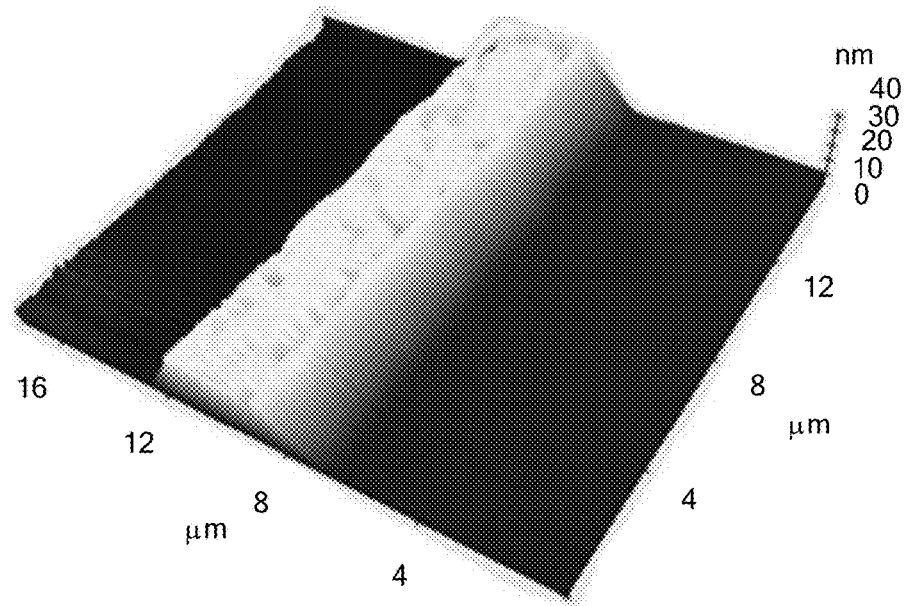
*FIG. 7A.2*

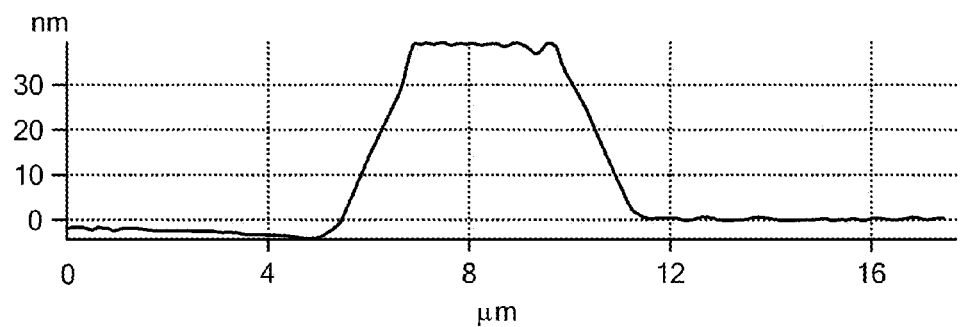
*FIG. 7A.3*
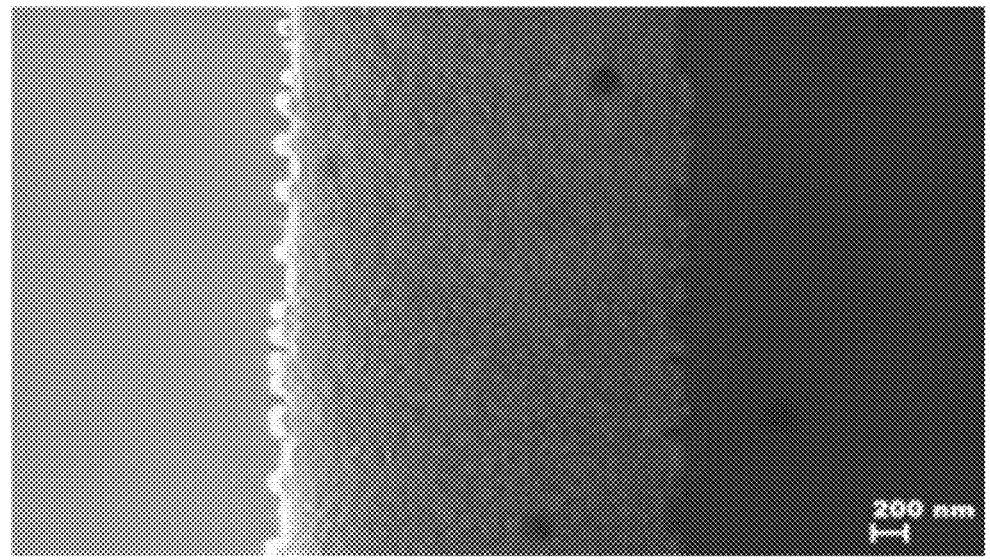
*FIG. 7A.4*

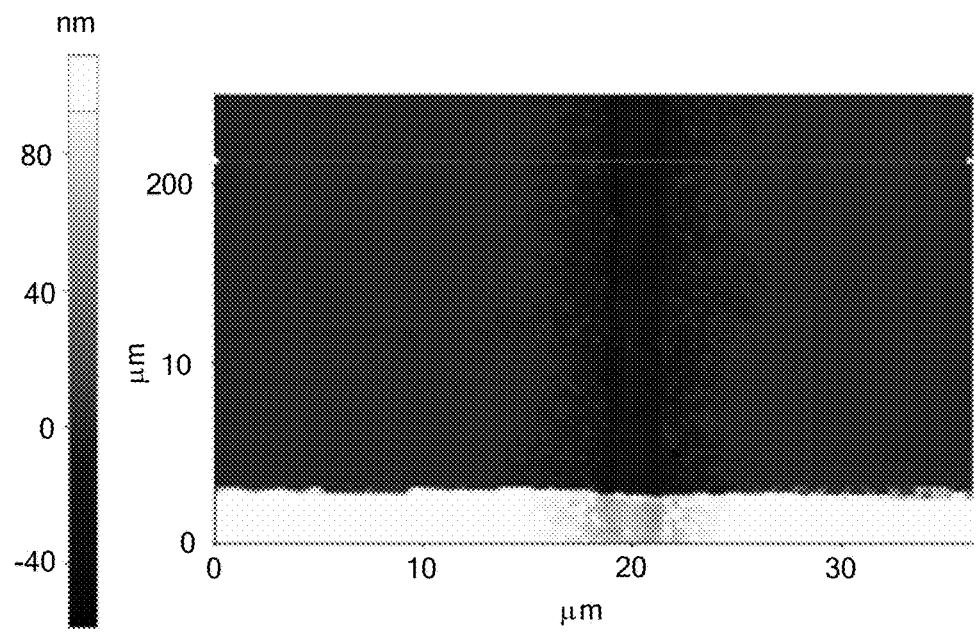
*FIG. 7B.1*
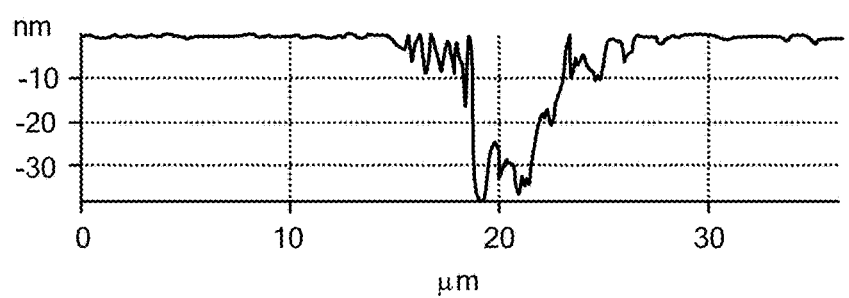
*FIG. 7B.2*

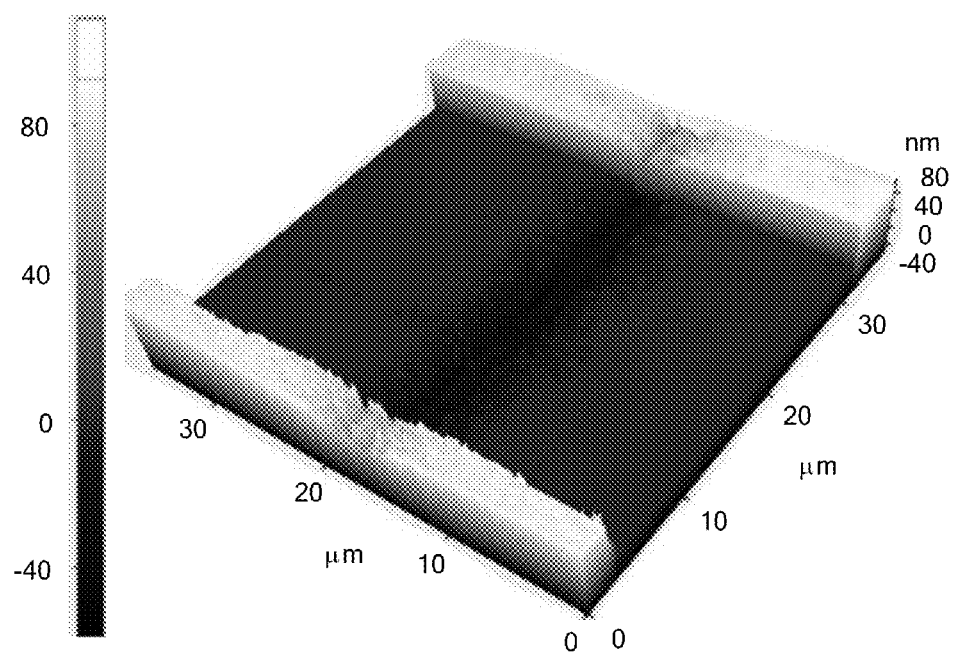
*FIG. 7B.3*

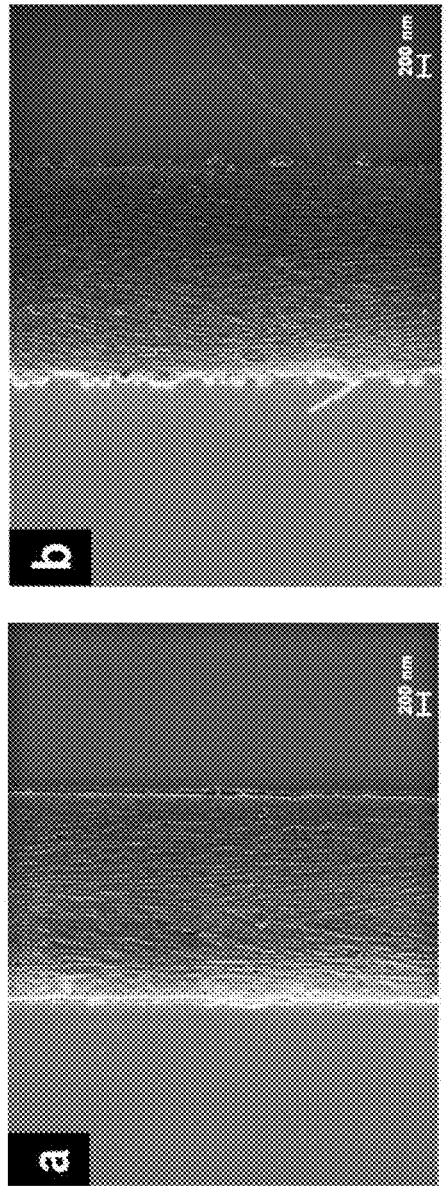
FIG. 11A
FIG. 11B
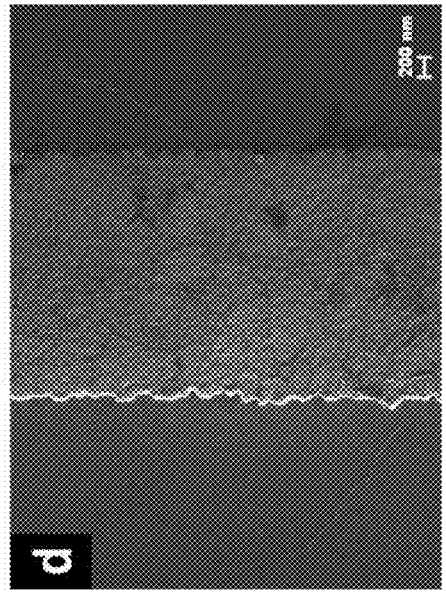
FIG. 11D
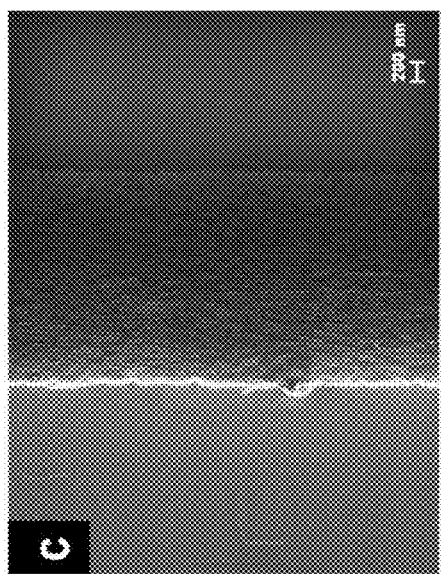
FIG. 11C

DAMASCENE TEMPLATE FOR DIRECTED ASSEMBLY AND TRANSFER OF NANOELEMENTS

CROSS REFERENCE TO RELATED APPLICATIONS

This is a divisional application of U.S. application Ser. No. 14/356,328, filed May 5, 2014, which is the U.S. national phase of PCT Application No. PCT/US2012/064176, filed Nov. 8, 2012, which claims the benefit of U.S. Provisional Application No. 61/556,904 filed Nov. 8, 2011, and U.S. Provisional Application No. 61/557,594 filed Nov. 9, 2011 and entitled "Damascene Template for Directed Assembly and Transfer of Nanoelements". Each of the aforementioned applications is hereby incorporated by reference in its entirety.

STATEMENT REGARDING FEDERALLY SPONSORED RESEARCH OR DEVELOPMENT

The invention was developed with financial support from Grant Nos. EEC-0832785 and 0425826 from the National Science Foundation. The U.S. Government has certain rights in the invention.

BACKGROUND

Assembly of nanoelements on a template with precise alignment and orientation followed by transfer of the nanoelements to a recipient substrate is expected to accelerate large-scale production of nanoscale devices. However, absence of highly versatile and reusable templates for high-throughput directed assembly and transfer with minimal deterioration have hindered any progress.

Various templates fabricated through bottom-up or top-down processes have been used to assemble nanoelements for achieving desired architectures [1-3]. The template-guided fluidic assembly process is amenable to a variety of nanoelements and can result in high assembly density, yield and uniformity [4-6]. However, the assembly process is very slow and hence not scalable. On the other hand, electrophoretic assembly involves assembling nanomaterials having a surface charge on a conductive surface over large areas (wafer scale) in a short period of time [7-10]. When nanoelements are assembled by electrophoresis on a topographically patterned electrode with interconnected microscale and nanoscale features, due to the differences in potential drop at various regions of the electrode, the assembly is non-uniform. Previously, this impediment has been circumvented by employing so-called "trench templates" in which a lithographically-defined polymer pattern lies on top of a uniform conducting layer guiding the assembly to the desired locations. Whenever assembled nanoelements in these trench templates needed to be transferred to a recipient substrate, the polymer has to be removed, thereby limiting the template's use to a single assembly and transfer cycle [11].

Transferring assembled nanoelements from one substrate to another while retaining their two-dimensional order is a rather cumbersome process requiring in-depth knowledge about the interaction energy between different materials and the nanoelements. Successful achievement of ordered nanoelement transfer onto flexible substrates would enable the production of various types of new devices such as thin-film transistors, gas sensors, and biosensors [12-14]. Even though transfer of nanoelements using a template sacrificial layer (e.g. $SiO_2$ layer) has been demonstrated for transfer onto flexible as well as rigid substrates, and with high transfer efficiency, such templates cannot be reused [15]. Intermediate sacrificial films such as PDMS and Revalpha thermal tape for transferring nanoelements to the recipient substrates have also been explored, but these introduce additional steps and hence result in a complicated fabrication process leading to higher production costs [16-17].

SUMMARY OF THE INVENTION

The invention provides highly reusable, topographically flat damascene templates and methods for assembled nanoelements onto the damascene templates using electrophoresis. The invention also provides methods for transferring assembled nanoelements from the damascene templates onto flexible substrates using a "transfer printing" method. The transfer printing method can be used for fabricating microscale and nanoscale structures, including combinations of microscale and nanoscale structures on a single chip, without the need for an intermediate film [18-19].

The inventors have designed and fabricated topographically flat damascene templates with submicron features using microfabrication techniques together with chemical mechanical polishing (CMP). These templates are designed to be compatible with various directed assembly techniques, including electrophoresis, with an essentially 100% assembly and transfer yield for different nanoelements such as single-walled carbon nanotubes and nanoparticles. These templates can be repeatedly used for transfer thousands of times with minimal or no damage, and the transfer process involves no intermediate processes between cycles. The assembly and transfer processes employed are carried out at room temperature and pressure and are thus amenable to low cost, high-rate device production.

One aspect of the invention is a damascene template for the electrophoretic assembly and transfer of patterned nanoelements. The template includes a substantially planar substrate, a first insulating layer, an optional adhesion layer, a conductive metal layer, a second insulating layer, and an optional hydrophobic coating. The first insulating layer is disposed on a surface of the substrate. The adhesion layer, if present, is disposed on a surface of the first insulating layer opposite the substrate. The conductive metal layer is disposed on a surface of the adhesion layer opposite the first insulating layer, or disposed on a surface of the first insulating layer opposite the substrate if the adhesion layer is absent. The second insulating layer is disposed on a surface of the conductive metal layer opposite the adhesion layer, or opposite the first insulating layer if the adhesion layer is absent. The hydrophobic coating is selectively disposed on exposed surfaces of the second insulating layer opposite the conductive metal layer; the hydrophobic coating is absent from the exposed surfaces of the conductive metal layer. The conductive metal layer is continuous across at least one region of the substrate, or in some embodiments across the entire substrate. Within the region of the conductive metal layer, the conductive metal layer has a two-dimensional microscale or nanoscale pattern of raised features that interrupt the second insulating layer, leaving the second insulating layer to substantially fill the spaces between the raised features. The exposed surfaces of the raised features and the exposed surfaces of the second insulating layer are essentially coplanar, due to planarization by a chemical mechanical polishing procedure.

Another aspect of the invention is a nanoelement transfer system for transfer of patterned nanoelements by nanoimprinting. The system includes the damascene template described above and a flexible polymer substrate for reception of said plurality of nanoelements. In some embodiments the system also includes a thermally regulated imprint device for applying pressure between the damascene template and the flexible polymer substrate at a selected temperature above ambient temperature.

Yet another aspect of the invention is a method of making the damascene template described above. The method includes the following steps:

(a) providing a substantially planar substrate;

(b) depositing a first insulating layer on a surface of the substrate;

(c) optionally depositing an adhesion layer onto the first insulating layer;

(d) depositing a conductive metal layer onto the adhesion layer, or onto the first insulating layer if the adhesion layer is absent;

(e) depositing a layer of lithography resist onto the conductive metal layer;

(f) performing lithography to create a two-dimensional pattern of voids in the resist layer, whereby the surface of the conductive metal layer is exposed in the voids;

(g) etching the exposed surface of the conductive metal layer;

(h) removing the resist layer, leaving the entire surface of the conductive metal layer exposed, wherein the conductive metal layer comprises a two-dimensional pattern of raised features;

(i) depositing an insulating material to cover the conductive metal layer, including the raised features;

(j) removing the insulating material and a portion of the raised features by a chemical mechanical polishing method, whereby the raised features and insulating material are planarized, leaving a two-dimensional pattern of raised features having exposed surfaces which are coplanar with one another and with exposed surfaces of the insulating material; and (k) optionally silanizing selectively the exposed surfaces of the insulating material with a hydrophobic coating of an alkyl silane.

In some embodiments, the method further includes the step of:

(l) chemically cleaning the exposed surfaces of the raised features of the conductive metal layer without substantially removing the hydrophobic coating on the insulating layer.

Still another aspect of the invention is a method of forming a patterned assembly of nanoelements on a damascene template. The method includes the steps of:

(a) providing the damascene template described above;

(b) submerging the damascene template in a liquid suspension of nanoelements;

(c) applying a voltage between the conductive metal layer of the damascene template and a counter electrode in the liquid suspension, whereby nanoelements from the suspension are assembled selectively onto exposed surfaces of the raised features of the conductive metal layer of the damascene template and not onto exposed surfaces of the second insulating layer of the damascene template;

(d) withdrawing the damascene template and assembly of nanoelements from the liquid suspension while continuing to apply voltage as in step (c); and (e) drying the damascene template.

Another aspect of the invention is a method of transferring a two-dimensional patterned assembly of nanoelements onto a flexible polymer substrate. The method includes the steps of:

(a) providing a patterned assembly of nanoelements on a damascene template, such as one made by the method described above, and a flexible polymer substrate;

(b) contacting the patterned assembly of nanoelements with the flexible polymer substrate and applying pressure, whereby the patterned assembly of nanoelements is transferred onto the flexible patterned substrate. In some embodiments, step (b) is performed at a temperature above the glass transition temperature of the flexible polymer substrate.

Still another aspect of the invention is a method of assembling and transferring a two-dimensional patterned assembly of nanoelements onto a flexible polymer substrate. The method includes the steps of:

(a) providing the nanoelement transfer system described above and a liquid suspension of nanoelements;

(b) performing electrophoretic assembly of nanoelements from the liquid suspension onto a damascene template according to the method described above to yield a patterned assembly of nanoelements on the damascene template; and (c) contacting the patterned assembly of nanoelements with the flexible polymer substrate and applying pressure, whereby the patterned assembly of nanoelements is transferred onto the flexible patterned substrate. In some embodiments, the step of contacting is performed at a temperature above the glass transition temperature of the flexible polymer substrate.

BRIEF DESCRIPTION OF THE DRAWINGS

FIGS. 1C.1, 1C.2, and 1C.3 show simulated electric field strength results at 2.5 V and pH 10.8 as a function of dishing amount. Electric field strength near the $SiO_2$ surface is of the same order of magnitude as that of Au electrode while non-uniformity in the electric field from the edge to the center of the electrode increases as the dishing amount increases. FIG. 1C.2 is top-viewed and FIG. 1C.3 is a cross-sectional view of the electric field strength contours with 25 nm dishing amount. The contours indicate that higher electric field strength is generated on the electrode edges. FIG. 1D shows a schematic representation of a cross-section of an embodiment of a damascene template of the invention. The structures shown are: substrate (10), first insulating layer (15), adhesion layer (20), conductive metal layer (30), with raised features (40), second insulating layer (50), and hydrophobic coating (60).

FIG. 4A shows SEM micrographs of a damascene template after transfer and FIG. 4B shows the transfer substrate with transferred SWNTs. FIG. 4C.1 shows an optical micrograph of highly organized SWNT arrays with metal electrodes on a PEN film. FIG. 4C.3 is an SEM micrograph and FIG. 4C.4 is an AFM image of the transferred SWNT with two metal electrodes. The atomic force microscopy (AFM) profile in FIG. 4C.2 shows that there are no indentations created on the transfer substrate.

FIG. 5A shows a schematic diagram of a conventional template used for electrophoretic assembly. In this template, nanowire electrodes are connected to a micron scale electrode, which is in turn connected to a large metal pad through which the potential is applied. Shown in FIG. 5B is a schematic of a damascene template in which both micron scale and nanometer scale electrodes are connected to a metal sheet underneath an insulating layer. Corresponding equivalent resistor circuits are shown in both figures, where Rm is the resistance introduced due to the micron scale electrode, Rn is that of the nanoscale electrode, while Rs is that of the solution. Shown in FIG. 5C are SEM micrographs of a typical nanoparticle assembly result obtained for configuration shown in FIG. 5A. Nanoparticles have assembled only on the micron scale electrodes and not on the nanoscale electrodes which are connected to them.

FIGS. 6A.1, 6A.2, and 6A.3 show electric field simulation results for various thickness of electrode protruding from the insulating surface. As the electrode protruding height increases, the non-uniformity in the electric field strength across the breadth of the electrode increases drastically, resulting in inconsistent assembly across the electrode. Shown in FIGS. 6B.1, 6B.2, and 6B.3 are the electric field simulation results for the conventional template shown FIG. 5A. Irrespective of the thickness of the electrode, the non-uniformity in the electric field strength still exists.

FIGS. 7A.1, 7A.2, and 7A.3 show AFM images and contour and FIG. 7A.4 shows an SEM image of a damascene template in which the metal electrodes protruded above the insulating surface by about 40 nm. FIGS. 7B.1, 7B.2, and 7B.3 show the AFM morphology of a flexible PEN substrate after transfer. Indented structures similar to those of the template appear on the PEN substrate; the indented structures are about 40 nm deep.

FIG. 8A shows nanoparticle assembly, and FIG. 8B shows SWNT assembly. The nanoelements were not specifically assembled onto the metal electrode but were also found on the insulator.

FIGS. 9A and 9B correspond to OTS SAM-coated $SiO_2$ surface (second insulating layer) before and after piranha solution treatment, respectively. The contact angle remained the same, establishing the fact that the OTS SAM layer remained intact. FIGS. 9C and 9D show an OTS SAM-coated gold surface before and after piranha solution treatment, respectively. A flat wafer with 150 nm thick gold layer sputtered onto it was used for these measurements instead of a patterned substrate. After piranha treatment, the contact angle was reduced drastically, indicating that the OTS SAM layer was removed.

FIG. 10A 1.5 V; FIG. 10B 2 V; FIG. 10C 2.5 V, and FIG. 10D 3 V. The rest of the assembly parameters were kept constant. As can be seen from the images, assembly efficiency on the metal electrode increases as a function of the applied electric field, and beyond a critical value the SWNTs begin to assemble everywhere, including the insulator.

FIGS. 11A-11D show top-viewed SEM micrographs of a damascene template after SWNT assembly for various withdrawal speeds: FIG. 11A 3 mm/min; FIG. 11B 5 mm/min; FIG. 11C 10 mm/min, and FIG. 11D 15 mm/min. The rest of the assembly parameters were kept constant. As can be seen from the images, the efficiency of assembly on the metal electrode decreases with increasing withdrawal speed, indicating the effect of removal moment acting on the SWNTs during withdrawal.

FIG. 13A 135° C.; FIG. 13B 150° C.; and FIG. 13C 160° C. The rest of the transfer process parameters were kept constant. As can be seen from the images, transfer efficiency (absence of SWNTs on the metal electrode after transfer) increases with increasing temperature, and ~100% transfer is achieved at process temperatures higher than Tg (155° C.) of the flexible substrate (PEN) onto which it is transferred.

DETAILED DESCRIPTION OF THE INVENTION

The invention provides methods for fabricating topographically flat damascene templates for the assembly and transfer of nanoelements. Patterned assemblies of nanoelements such as nanoparticles and carbon nanotubes can be produced on the damascene template and transferred to desired locations on a receptor substrate, with resulting high density and good uniformity of the patterned nanoelements. Transfer of assembled SWNTs or other nanoelements onto a flexible substrate can be performed without any intermediate steps and without a need for sacrificial films. The damascene templates of the invention are reusable and can be employed in a high rate assembly and transfer process. In addition, the damascene templates of the invention are compatible with various types of nanoelements. The products and methods of the invention can provide drastic advancements in high rate manufacturing of flexible devices, such as electrical and optical devices, such as display devices and strain guages, as well as biosensors and chemical sensors.

Figure 1A:
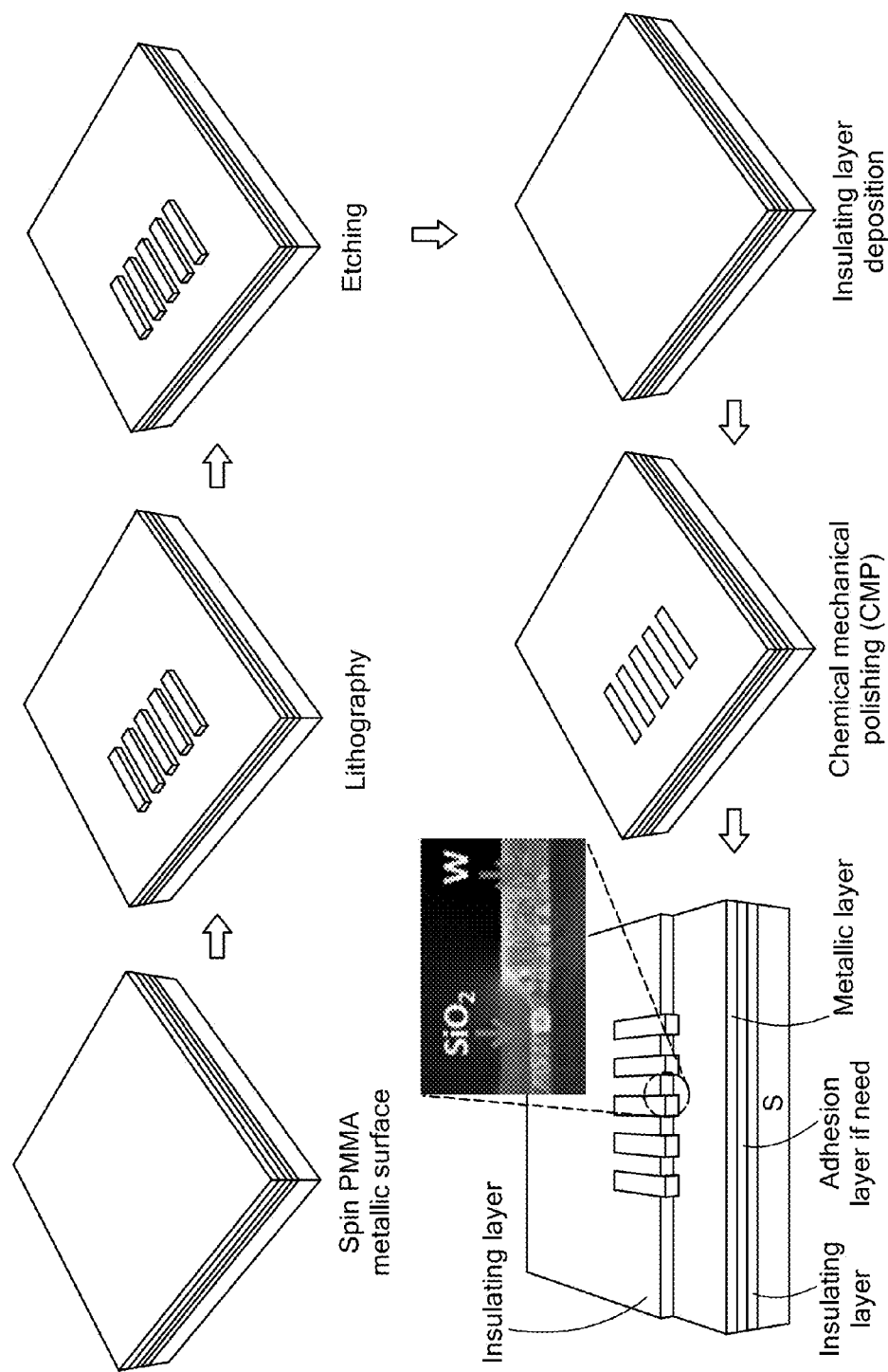
FIG. 1A shows a schematic of damascene template fabrication process. Resist was spun onto a Au/Si substrate and nanolithography was employed to define the patterns. Patterned Au was etched partially and plasma-enhanced chemical vapor deposition (PECVD) oxide ($SiO_2$) was deposited on the Au surface. Excess $SiO_2$ was removed by a chemical mechanical polishing (CMP) process until the top surfaces of the Au raised features were revealed. Inset shows an artificially colored cross-sectional scanning electron microscopy (SEM) micrograph exhibiting the metal electrode (raised metal features) to be at the same height as that of the $SiO_2$.

A schematic illustration of a process of damascene template fabrication is shown in FIG. 1A. Initially, a metallic layer (e.g., Au or W) is deposited on an electrically insulating substrate, and lithography is carried out to create a desired pattern for nanoelement assembly. Subsequently, partial etching of the metallic layer is conducted to form raised features having dimensions on the micrometer and/or nanometer scale. The raised features protrude above the plane of the rest of the metallic conductive layer. A thick layer of insulating material (e.g., $SiO_2$ or $SiN_4$) is blanket deposited on these patterned structures. A chemical mechanical polishing (CMP) process is then carried out to remove the insulating material until it is essentially coplanar with the top surfaces of the raised metal features, and until the top surfaces of the raised metal features are coplanar with one another across the substrate, or a portion of the substrate.

Thus, the resulting damascene template has nano/micro features connected by a conductive film underneath an insulator (second insulating layer), which enables all of the micro/nano structures on the whole substrate, or a desired region of the substrate, to have equal potential during electrophoretic assembly. Preferred materials are gold for the metallic layer and PECVD-deposited silicon dioxide for the insulating layer.

FIG. 1D shows a cross-sectional view of a damascene template embodiment of the invention. The substrate (10) is a base layer of electrically insulating material, such as silicon or a polymer. The substrate is essentially planar on at least one surface, or is entirely planar, and in some embodiments is substantially rigid, while in other embodiments is flexible and can be bend to conform to a desired shape. The substrate can have any size or shape required for the particular application, but generally has a thickness of about 1 µm to about 10 µm, or about 100 µm or less, or about 1000 µm or less and a surface area on a planar surface of about 0.005 mm$^2$ or more, up to several cm$^2$. The substrate can be fabricated from electrically insulating materials including silicon, silicon dioxide, organic polymers including epoxies and liquid crystal polymers, or a photoresist material such as SU-8. The first insulating layer (15) is a layer of insulating material (e.g., $SiO_2$, $SiN_4$, or a polymer) which is deposited or induced to form on the surface of the substrate on which the conductive layer will be deposited and nanoelements will be assembled. The thickness of the first insulating layer is, for example, in the range from about 10 nm to about 10 µm, or about 20 nm to about 1 µm, or about 30 nm to about 500 nm, or about 5 nm to about 500 nm, or about 40 nm to about 250 nm, or about 50 nm to about 100 nm. The first insulating layer is generally planar in structure and extends over the entire substrate layer, or a portion of the substrate layer. The first adhesion layer prevents current leakage from the conductive layer into the substrate during electrophoretic assembly. Adhesion layer (20) is an optional layer deposited onto the first insulating layer. The adhesion layer provides improved adhesion of the conductive layer to the first insulating layer, so that the conductive layer remains in place when voltage is applied to the conductive layer during electrophoretic assembly. Suitable materials for the adhesion layer include chromium, titanium, titanium dioxide, titanium nitride, tantalum, tantalum nitride, tungsten, and combinations thereof. The thickness of the adhesion layer can be, for example, from about 3 nm to about 50 nm. Conductive layer (30) is a layer of conductive metal deposited on the adhesion layer (if present) or the first insulating layer (in embodiments with no adhesion layer). Suitable materials for the conductive layer include metals such as gold, silver, tungsten, aluminum, titanium ruthenium, copper, and combinations or alloys thereof. The conductive layer has two portions: (i) a planar base layer (thickness from about 50 nm to about 100 µm), and (ii) a plurality of raised features (40) which extend above the plane of the base layer (for example, from about 10 nm to about 10 µm in height) and which have electrical continuity with one another through the base layer of the conductive layer. Second insulating layer (50) is initially deposited over the entire conductive layer, including the raised features, and then planarized by chemical mechanical polishing so as to render coplanar the upper exposed surfaces of the second insulating layer and the raised features. The thickness of the second insulating layer can be, for example, from about 10 nm to about 10 µm and is generally about the same as the height of the raised metal features. In some embodiments, the thickness of the second insulating layer and the raised features is the same to within +/−1 µm, 100 nm, 10 nm or even 5 nm or 2 nm. The second insulating layer fills the spaces between the raised features and provides electrical insulation in those regions which inhibits the assembly of nanoelements during electrophoretic assembly. Suitable materials for the second insulating layer include $SiO_2$, $SiN_4$, $Al_2O_3$, organic polymers, and combinations thereof. In order to further inhibit nanoelement assembly in the insulated regions, those regions are preferably coated with a hydrophobic coating (60). The hydrophobic coating is preferably a self-assembled monolayer (SAM) of an alkyl silane (which covalently bonds to $SiO_2$ if that material is used in the second insulating layer). The silane can be, for example, octadecyltrichlorosilane, or a similar silane having an alkyl chain of about 8-24 carbons in length. The preferred thickness of the hydrophobic coating is one molecule, though it can also be more than one molecule. The purpose of the hydrophobic coating is to prevent the assembly of nanoelements on the exposed surface of the second insulating layer; as such, it only needs to render the exposed surface of the second insulating layer hydrophobic, and to be selectively bound to the second insulating layer and preferably not bound to the exposed surface of the conducting layer, where nanoelements are to be assembled. The hydrophobic coating has a contact angle of from 90° to 110°, preferably about 100°. In contrast, the exposed metal conductive layer surface has a contact angle of from 15° to 21°, preferably about 18°.

Fabrication techniques for making a damascene template of the invention are known to the skilled person. Such techniques as micro- and nanopatterning can be carried out by e-beam lithography, photolithography, and nano-imprint lithography. Deposition of metals can be performed by sputtering, chemical vapor deposition, or physical vapor deposition. Deposition of polymers and resists can be performed by spin coating. $SiO_2$ as the second insulating layer can be deposited by plasma enhanced chemical vapor deposition (PECVD). Etching of the second insulating layer and metal conductive layer can be by ion milling, ion-coupled plasma (ICP) and reactive ion etching (RIE). The two-dimensional pattern of the raised features of the metal conductive layer, and correspondingly the pattern of assembled nanoelements, can be any pattern that can be established using lithographic techniques, including linear features that are straight, curved, or intersecting as well as geometric shapes such as circles, triangles, rectangles, or dots. The raised features can have a width in the range from about 10 nm to about 100 μm, and a length from about 10 nm to several cm (e.g., the full diameter of a wafer).

Figure 1B:
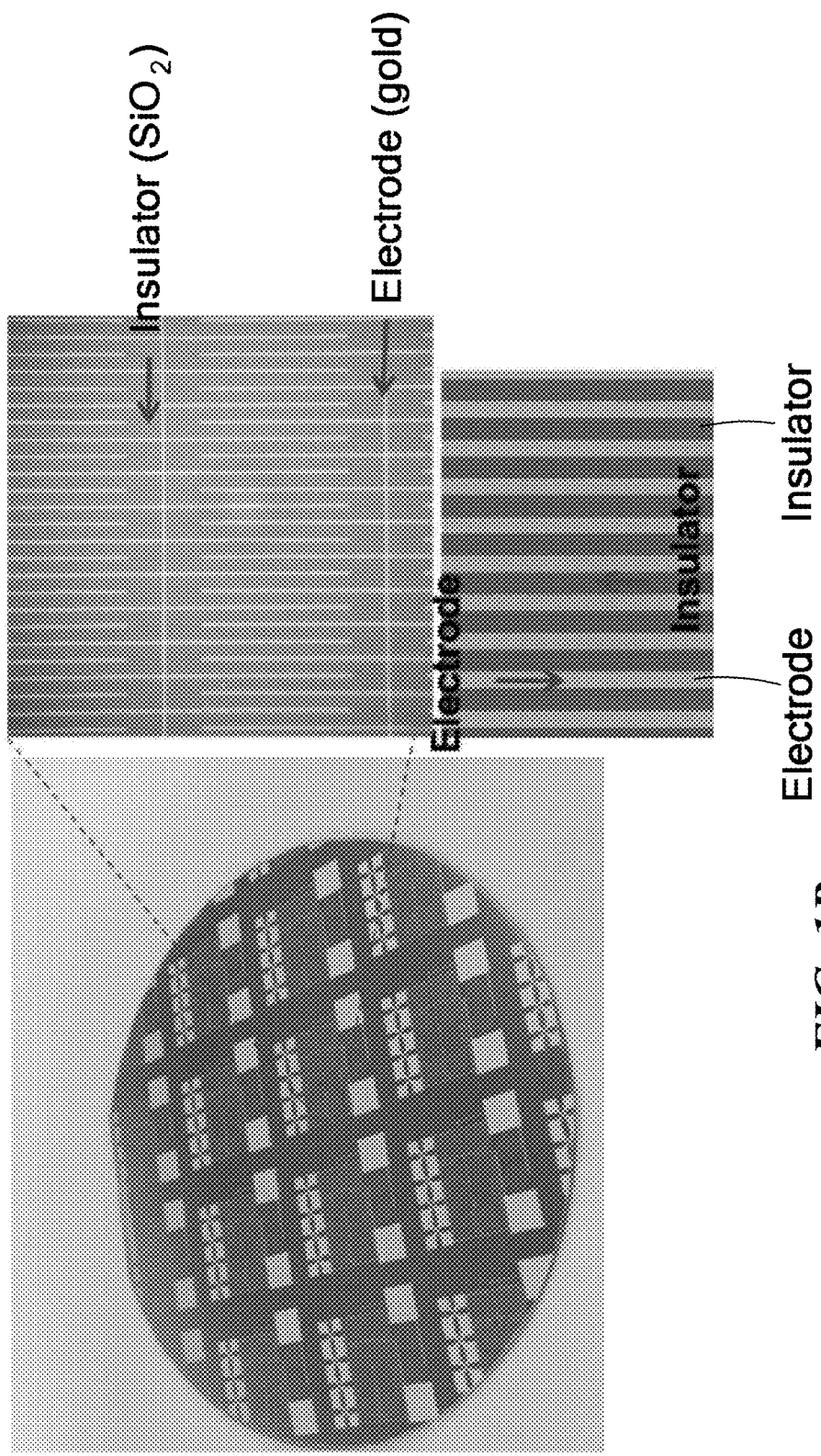
FIG. 1B shows an optical image of a 3-inch damascene template with high-resolution SEM images as the insets.

The damascene template topography has significant impact on the efficiency and yield of the assembly and transfer processes. Ideally a flat topography is used, which provides a uniform electric field from edge to the center of the electrodes, with minimal variation and facilitating uniform assembly (see FIGS. 6A.1-A.3 and 6B.1-B.3). FIG. 1C shows a plot of the simulated electric field strengths for various level differences between the metal and the insulator (dishing amount). It is evident that as the dishing amount increases, the non-uniformity in the electric field from the edge to the center of the electrodes also increases. In addition, a non-flat topography can result in uneven transfer, creating indentations on the transfer substrate surface (see FIGS. 7A.1-A.4 and 7B.1-B.3). To achieve a flat topography, the end point detection in the CMP process needs to be precise [20]. For example, sufficiently precise control can be achieved by determining the time period required for CMP based on the associated material removal rate. A top view and cross sectional view of a damascene template after CMP resulting in a flat topography are shown in FIG. 1A. An optical image of a 3-inch damascene template is shown in FIG. 1B, with high resolution SEM images shown as insets.

It is apparent from FIG. 1C that the electric field strengths close to the electrode and the insulator are of the same order of magnitude. In addition any organic contamination removal process, such as cleaning with piranha solution (a solution containing a mixture of $H_2SO_4$ and $H_2O_2$), can increase the surface energy of the metal and that of the insulator. During an electrophoretic assembly process, a substantial electric field near the $SiO_2$ surface in conjugation with $SiO_2$ having a high surface energy can result in nanoelement assembly even onto the $SiO_2$ surface that is undesired (see FIGS. 8A-8B).

To assemble the nanoelements specifically on the gold electrode surface, the electric field strength near the $SiO_2$ surface and its surface energy should be decreased. Reducing the electric field strength through application of lower voltage would also reduce the electric strength near the gold surface drastically affecting assembly of nanoelements on the gold electrode. Alternatively, if the surface energy of $SiO_2$ is reduced without affecting that of the electrode, assembly can be achieved specifically on the gold electrodes. Self-assembled monolayers (SAMs) can be employed to reduce the surface energy of the $SiO_2$ surface significantly. A preferred material for preparing a SAM for coating the exposed surfaces of the $SiO_2$ second insulating layer is octadecyltrichlorosilane (OTS); OTS can be used to modify the surface energy of the $SiO_2$ layer without affecting the surface energy of the raised gold features. Application of a SAM consisting essentially of OTS increased the contact angle of $SiO_2$ to 100° from an initial value of less than 10°. A post treatment process was developed to selectively remove the physically attached OTS SAM layer from the gold without disturbing the OTS SAM layer on the $SiO_2$ surface (see FIGS. 9A-9D).

Figure 2:
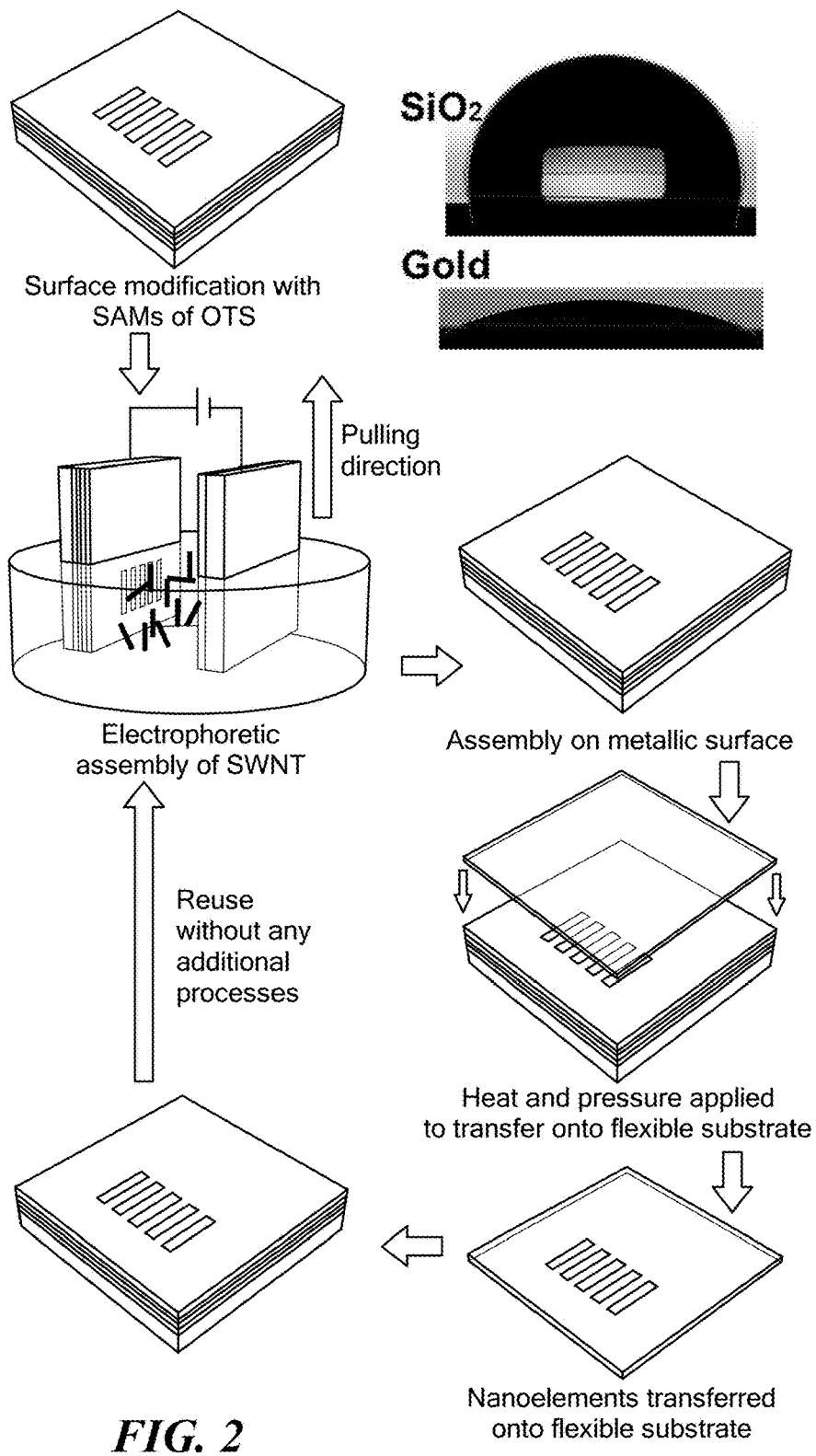
FIG. 2 is a schematic of the assembly and transfer process using damascene templates. The insulating ($SiO_2$) surface of the damascene template is selectively coated with a hydrophobic self-assembled monolayer (SAM) of octadecyltrichlorosilane (OTS). Using electrophoresis nanoelements are assembled on the electrodes of the damascene template, which are then transferred to a flexible substrate using a printing transfer method. After transfer the template is ready for the next assembly and transfer cycle.
Figure 3A:
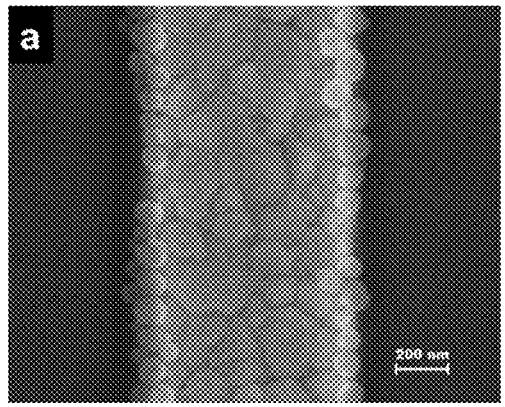
FIG. 3A shows a top viewed SEM micrograph of assembled silica particles on a damascene template. The applied voltage during assembly was 2 V, and the withdrawal speed was 1 mm/min. 100 nm silica particles assembled only on the edge of gold electrode (shown in FIG. 1B).

FIG. 2 shows an illustration of an assembly and transfer process using a damascene template of the invention. Electrophoresis is employed to achieve directed assembly of nanoelements, while a transfer printing method is employed to transfer the assembled nanoelements onto the surface of a flexible substrate. The surface-modified template is immersed into a suspension containing uniformly dispersed nanoelements. The properties of the solution (e.g., pH of an aqueous suspension) are adjusted such that the nanoelements have a charge (negative or positive). DC voltage is applied between the damascene template (having a polarity opposite to the charge on the nanoelements) and a bare gold template (having a polarity opposite to that of the damascene template), which acts as counter electrode. For example, alkaline pH can render the nanoelements negatively charged, the damascene template can be positively charged, and the counter electrode negatively charged. Voltage is applied for a brief period, typically less than one minute (e.g., for a 20 sec. time period). The charged nanoelements are selectively assembled on the electrode surface and not on the insulator. With the potential still being applied, after assembly, the template and the counter electrode are withdrawn from the suspension with a constant speed. It is critical to have the potential applied during withdrawal, since the hydrodynamic drag on the assembled nanoparticles is strong enough to remove them if the potential is not applied [21]. Typical assembly results for nanoparticle assembly are shown in FIGS. 3B-3D.

For a given charge on the nanoelements, the applied voltage between the template and the counter electrode considerably dominates the assembly efficiency of nanoelements (see FIGS. 10A-10D). For low voltages, the electric field strength at the electrode edges is strong enough to attract and assemble the nanoelements, while at the center it is not and hence no assembly occurs. The withdrawal speed also has an impact on the assembly efficiency (see FIGS. 11A-11D). For an applied potential of 2V, 100 nm silica nanoparticles (suspended in deionized water with pH 10.8, adjusted by addition of $NH_4OH$) assembled only on the edges of gold wires, as shown in FIG. 3A. An extremely low withdrawal speed (1 mm/min) can be used under these conditions, so that the dynamic drag force on the particles is insignificant. This is confirmed by the electric field contours simulated by a 3D finite volume modeling software (Flow 3D), shown in FIG. 1C.

Figure 3B:
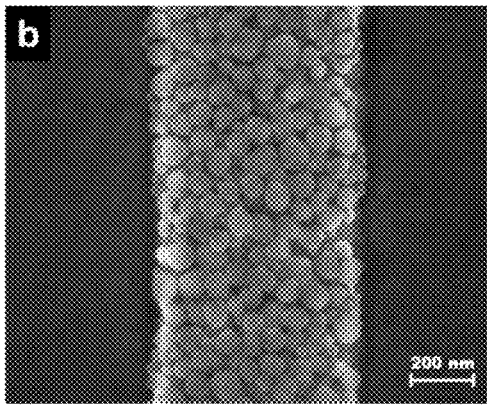
FIG. 3B is an SEM micrograph of a typical high-density 100 nm silica nanoparticle assembly result for assembly at 2.5 V and withdrawal speed of 5 mm/min. Despite the increase in withdrawal the assembly of nanoparticles was uniform.
Figure 3C:
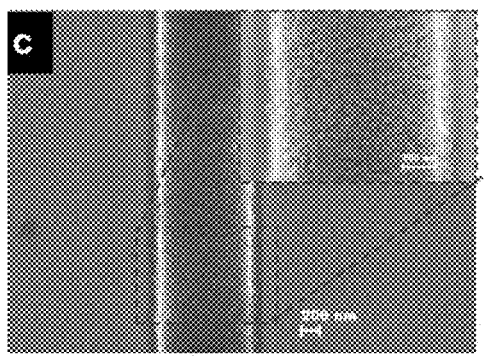
FIG. 3C shows 50 nm PSL particles assembled on the gold electrode surface with high density using the same conditions as for 100 nm silica nanoparticles.
Figure 3D:
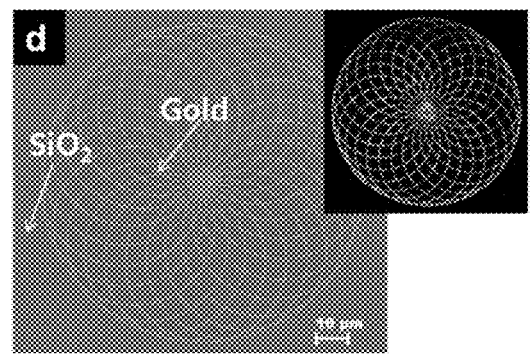
FIG. 3D shows 100 nm fluorescent silica particles assembled on complex 2-D patterns demonstrating the versatility of the damascene template. The inset figure is a fluorescence microscope image of the assembled silica particles.
Figure 3E:
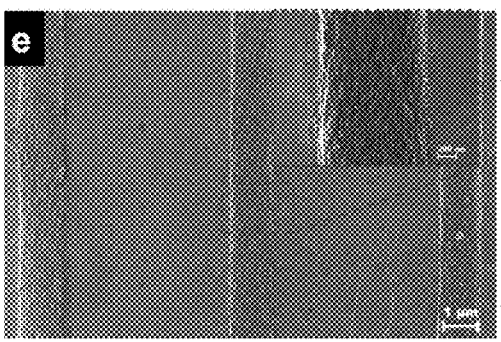
FIG. 3E shows an SEM image of a highly dense and organized single-walled carbon nanotube (SWNT) assembly that was achieved at an applied voltage of 2.5V while the withdrawal speed was maintained at 5 mm/min.
Figure 3F:
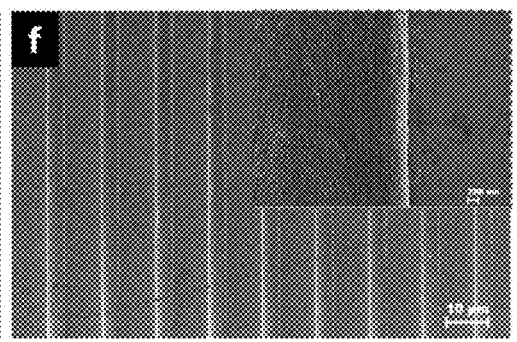
FIG. 3F shows an SEM micrograph of assembled SWNTs over a large scale exhibiting uniformity.

When the applied potential was increased to 2.5 V, 100 nm silica particles assembled at all regions across the electrodes in the damascene template, even at a 5 mm/min withdrawal speed, as shown in FIG. 3B. The efficacy and material compatibility of the assembly process was demonstrated by assembling (i) silica nanoparticles onto complex two-dimensional patterns (FIG. 3D), (ii) 50 nm polystyrene-latex (PSL) particles (FIG. 3C), and (iii) highly organized dense assemblies of SWNT (FIGS. 3E, 3F). For many applications highly aligned SWNTs are desired instead of random networks, because aligned SWNTs avoid percolation transport pathways and result in minimal junction resistance between tubes [22-24] due to more surface area overlap. The alignment of assembled SWNTs depends on the direction and speed of template withdrawal. Lower withdrawal speed leads to better alignment, with a trade-off of increased assembly process time.

Figure 5B:
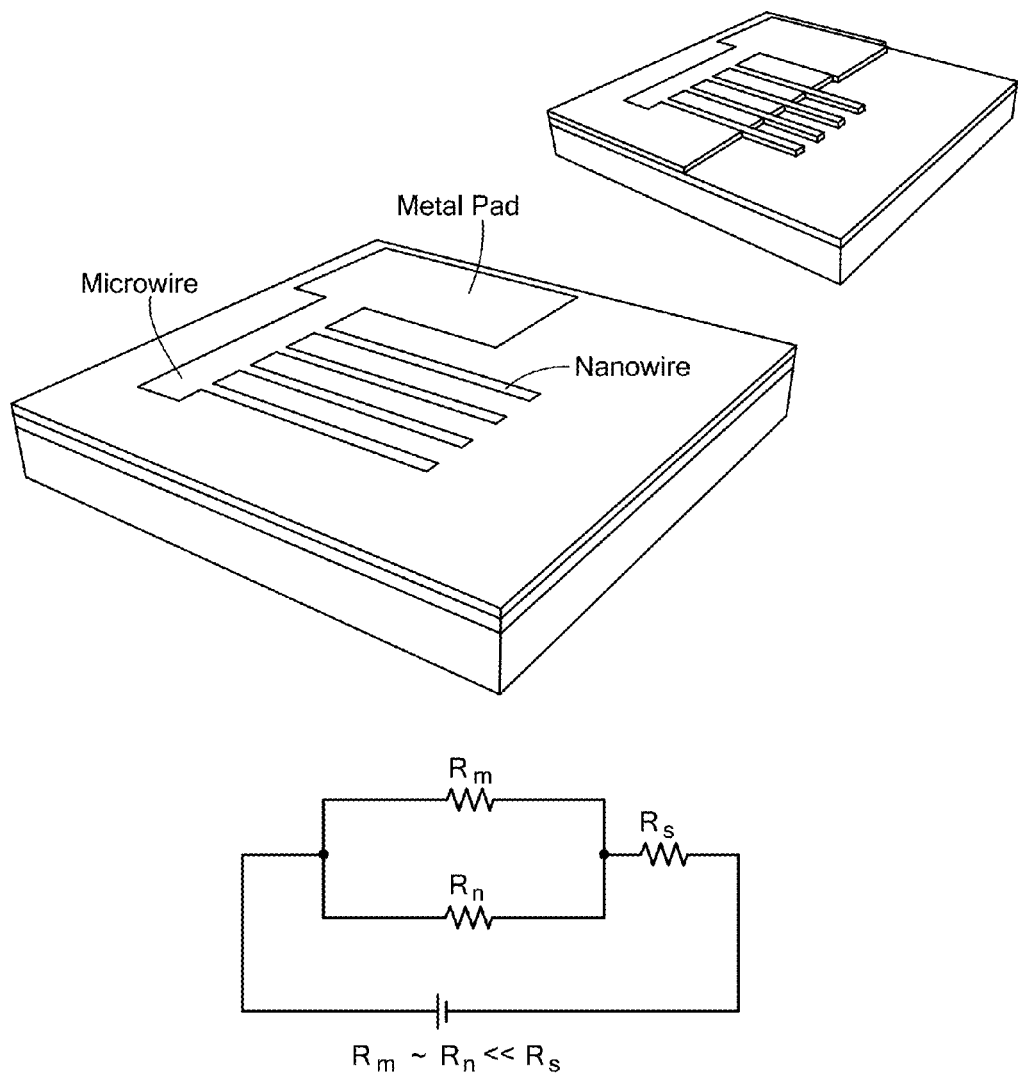
Figure 5C:
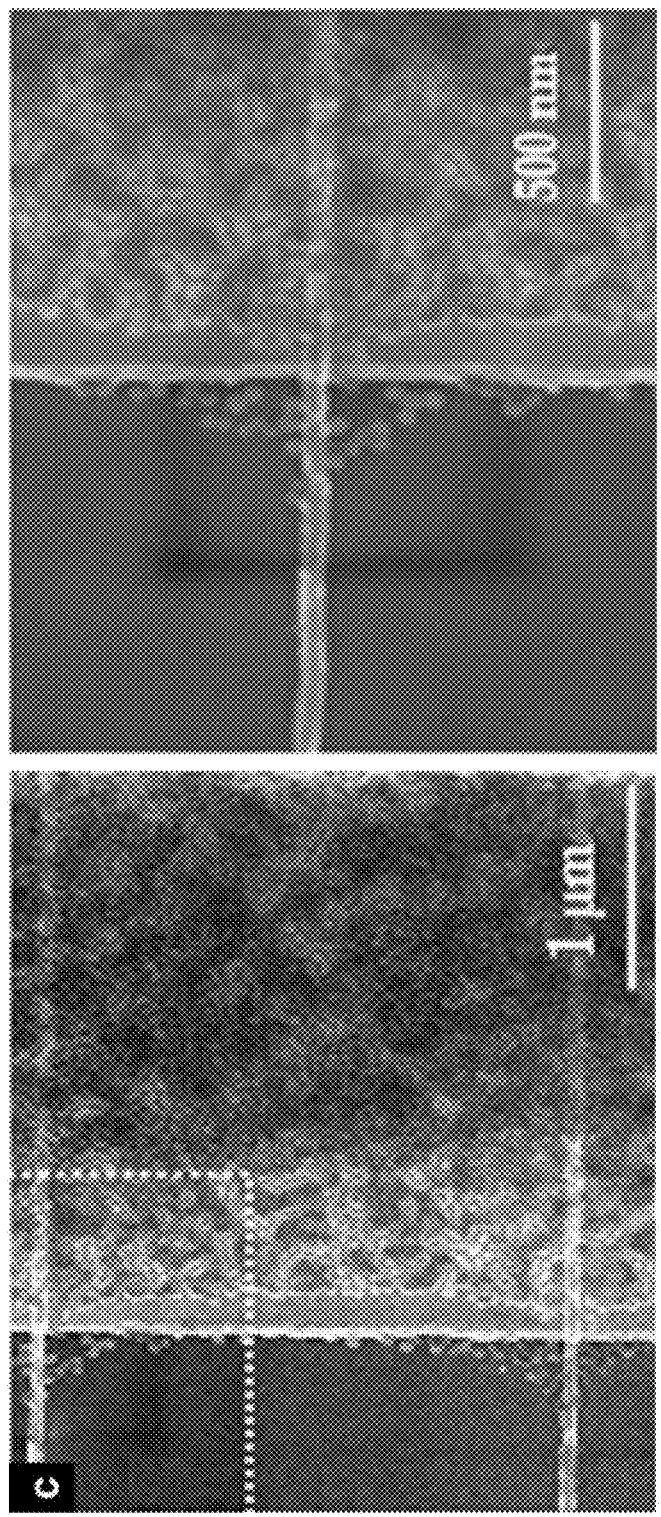

Damascene templates for assembling nanoelements may involve both nanoscale and micron scale geometries and employ electrophoresis to drive directed assembly. That is, nanoscale and micron scale electrodes can be patterned on an insulator such that the nanoscale metal electrodes are connected to micron scale counterparts which are then connected to a large metal pad (as shown in FIG. 5A). During assembly using previous template designs, when a potential is applied to the large pad, there is a large potential drop across the length of the nanowires due to the increased resistivity of the nanoscale features. This potential drop has a significant impact on the assembly results, and can yield a non-uniform assembly on various portions of the template. A typical result is shown in FIG. 5C, in which nanoparticle assembly occurs only on the micron scale electrodes and not on the nanoscale electrodes that are connected to them. With the damascene templates of the present invention, however, since all the nanoscale and micron scale electrodes are connected to the metal sheet underneath the insulator (FIG. 5B), when a potential is applied to the metal sheet during nanoelement assembly there is negligible variation in the electric potential between the micron scale and nanoscale electrodes. Equivalent resistor circuits are shown for both the conventional template as well as the damascene template.

Flow 3D software (v.10) from Flow Science, Inc. was used to simulate the electric field contours for various template dimensions. The input parameters were: (i) applied voltage 2.5 V, (ii) conductivity, (iii) pH 10.8, (iv) insulator thickness 150 nm, (v) dielectric constants for the insulator and the solution (4 and 80, respectively), and (iv) Mesh size 5 nm and 100 nm for distance less than 1 micron and greater than 1 micron respectively. The effective electric field contours were generated at a distance of 25 nm from the surface. Shown in FIGS. 6A.1-6A.3 are the electric filed simulation results for various non-flat topographies of the damascene templates. As the topography approaches being flat, the non-uniformity in the electric field strength across the metal electrode decreases. Shown in FIGS. 6B.1-6B.3 is the simulated result for a conventional template in which the nanoscale electrode is not connected to a metal electrode underneath. Due the morphology and topology variation, the non-uniformity of the electric field across the electrode is highly pronounced, which can lead to assembly only at the edges of the electrode.

Figure 12:
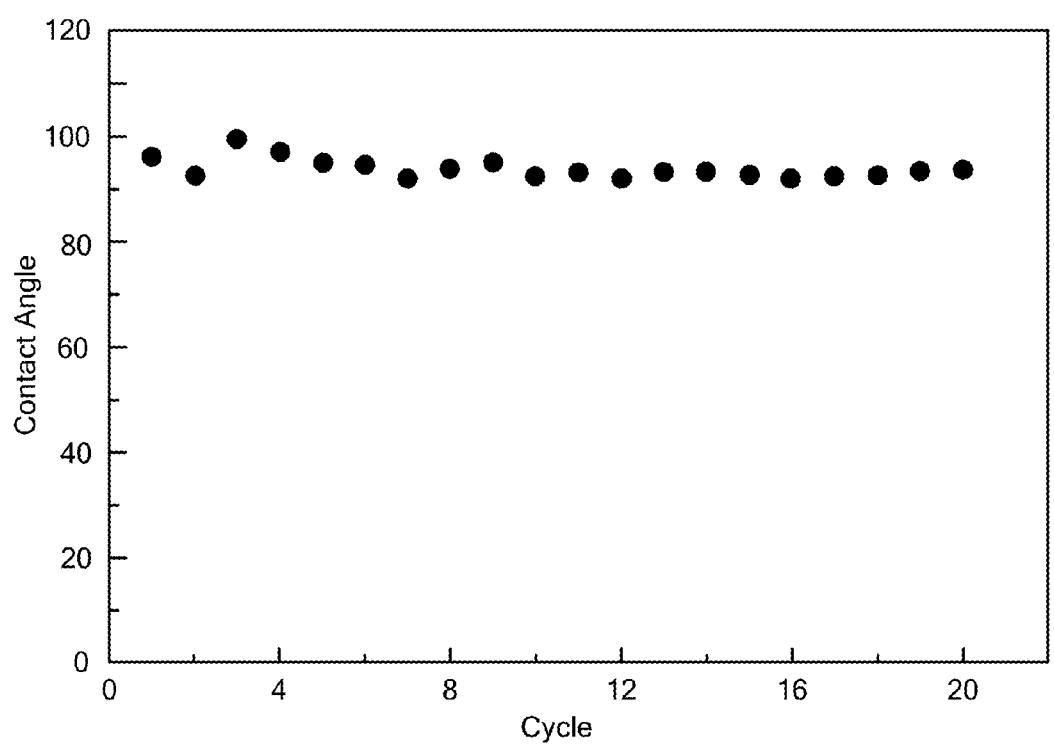
FIG. 12 shows a plot of the contact angle measurement of the OTS SAM coated $SiO_2$ surface as a function of the number of assembly and transfer cycles. The slope of the linear fit is ~−0.18 indicating the robustness of the damascene template in withstanding the wear and tear of multiple assembly and transfer cycles.

The assembled nanoelements were then transferred onto flexible polymer substrates (e.g., PEN, PC) using a nanoimprint tool. The transfer efficiency of the transfer printing process is primarily determined by the differential adhesion force between subject (nanoelements)/template (ST) and nanoelement/recipient (SR). If the adhesion force between nanoelement and template, FST, is smaller than the adhesion force between nanoelement and recipient, FSR, the nanoelements will be transferred onto the recipient surface. If the contrary is true, the nanoelements will remain on the template surface after the transfer process [18]. During transfer, the OTS SAM hydrophobic coating on the $SiO_2$ layer plays the additional role of being an anti-stiction layer when the damascene template is separated from the flexible substrate during transfer. This transfer process does not significantly affect the OTS layer and hence the surface energy of $SiO_2$, which enables the damascene template to be reused for assembly-transfer cycle without additional surface modification for several hundred cycles (see FIG. 12). Also, no additional processes such as stripping, patterning, or sacrificial layer removal/deposition are needed.

Figure 4D:
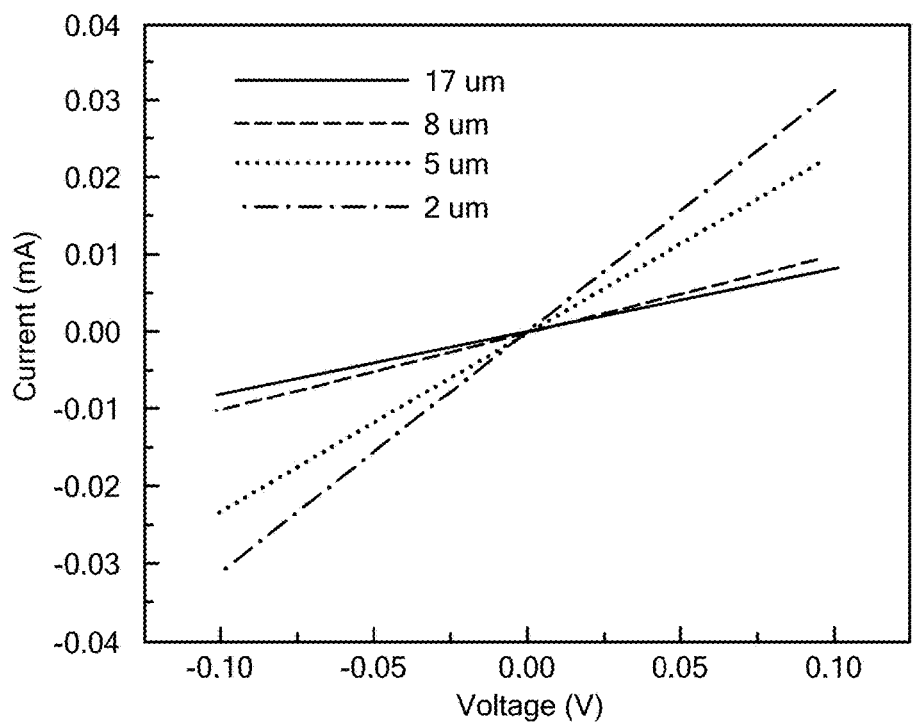
FIG. 4D shows I-V characteristics for various channel length and fixed channel width (2.4 μm).
Figure 4E:
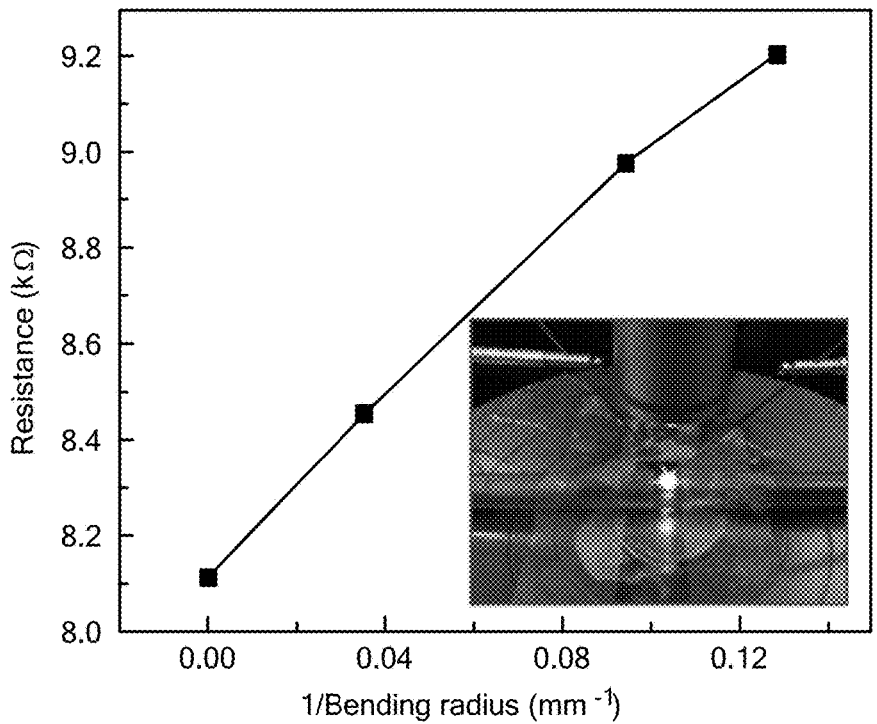
FIG. 4E shows the change in resistance of an SWNT channel (2.4 μm width and 30 μm length) as a function of bending radius of PEN substrate.
Figure 13A:
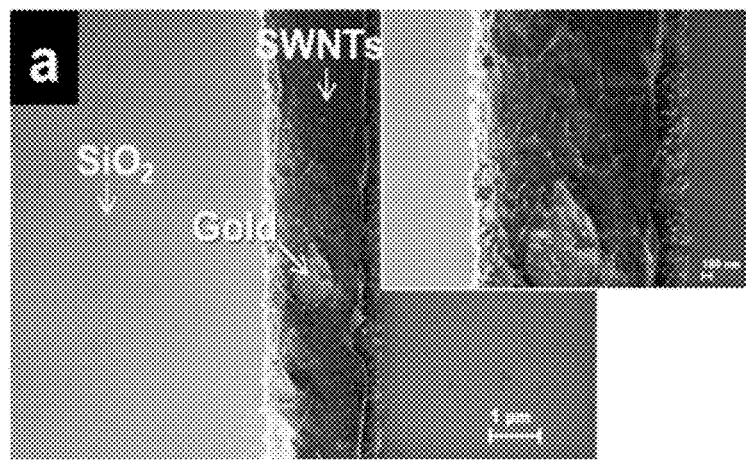
FIGS. 13A-13C show top-viewed SEM micrographs of a damascene template after transfer of SWNTs for various temperatures during the transfer.
Figure 13B:
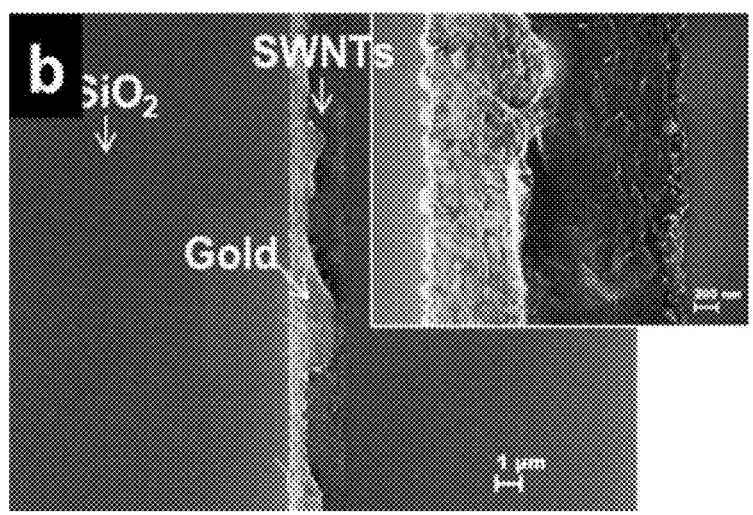
Figure 13C:
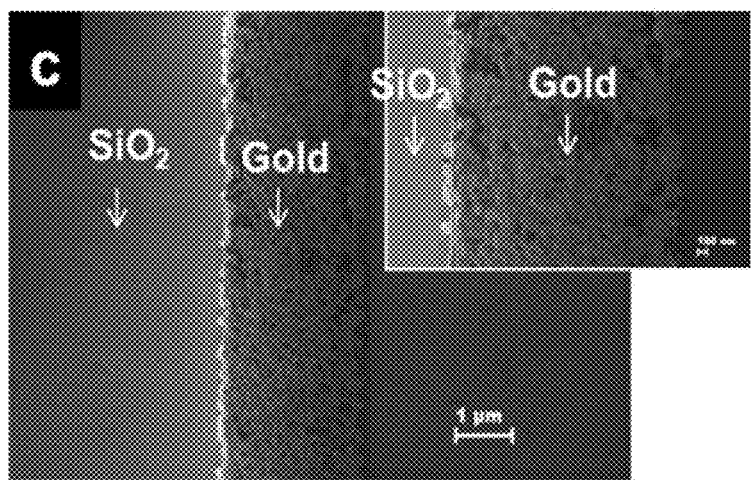

In general, the contact angle of the polymer films used to coat the second insulating layer is ~70°, which is very close to being hydrophobic and hence low surface energy. In order to improve the adhesion between assembled nanoelements and the polymer film (FST), the polymer film was pretreated using oxygen plasma in an inductively coupled plasmatherm before the transfer printing process was carried out. This procedure results in the creation of hydroxide groups on the polymer surface, thereby increasing the surface energy of the polymer film [25] [26]. After surface treatment, the contact angle of the polymer film was found to be less than 5°. For the transfer printing process of the invention, a process temperature of about 160° C. was maintained, while a pressure of 170 psi was used. This temperature is slightly higher than the glass transition temperature of the polymer film (155° C. for PET and 150° C. for PC) and is required to engulf the assembled nanoelements, such that a complete transfer can be achieved [19] (see FIGS. 13A-13C). To measure the electrical properties of these transferred SWNTs metal electrodes were fabricated by standard microfabrication processes. FIGS. 4C.1-4C.4 show the I-V measurement of the transferred SWNTs (2.4 μm channel width) on a PEN film as function of channel length. The measured resistance was 3.2 kΩ and 12.2 kΩ for channel lengths of 2 μm and 17 μm respectively. FIG. 4D exhibits the robustness of the assembled SWNT structure under bending. The resistance increases linearly as a function of bending radius with a maximum change of 13% compared to that of the initial value (see FIG. 14).

During transfer of assembled nanoelements using a template with non-flat topography (i.e., having raised metal features) onto a flexible substrate, the transfer might be expected to be partial rather than complete. Another possible result is the creation of imprinted structures (replica of the template) on the flexible substrate. In many cases this is not a desired result, since subsequent processing (metal deposition, etching, etc) can yield devices with non-uniform characteristics. Such an observed result using a non-flat topography damascene template is shown in FIGS. 7A.1-7A.4 and 7B.1-7B.3.

Figure 8A:
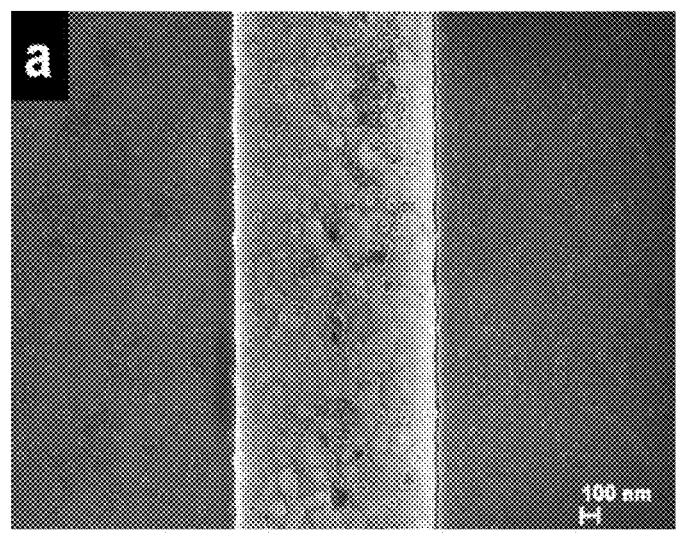
FIGS. 8A and 8B show top-viewed SEM micrographs of damascene templates after assembly. The damascene templates shown were not treated with an OTS SAM layer.
Figure 8B:
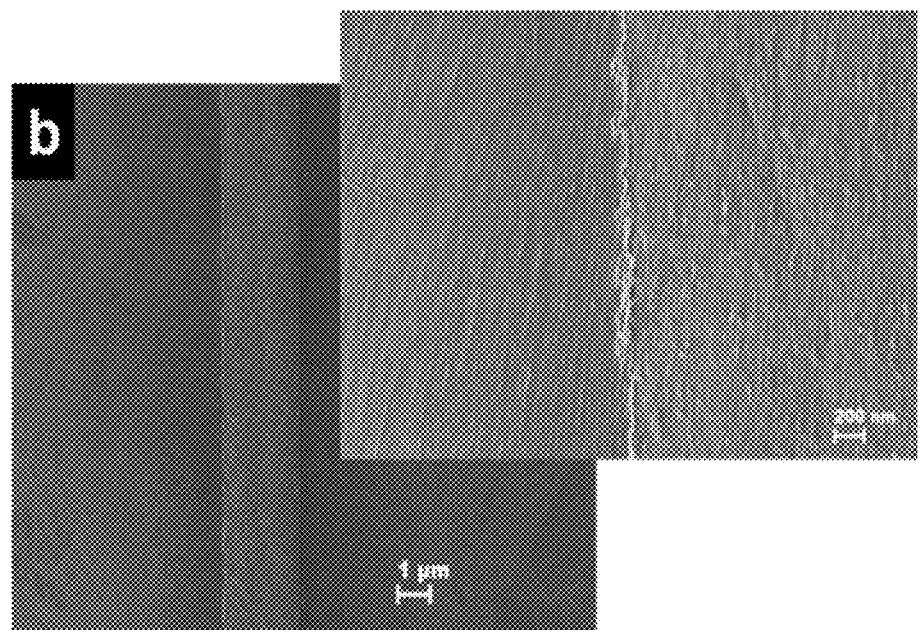
Figure 9A:
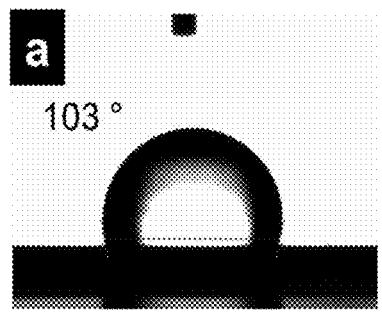
FIGS. 9A-9D show contact angle measurements of the OTS SAM coated metallic and insulating surfaces before and after treatment with piranha solution.
Figure 9B:
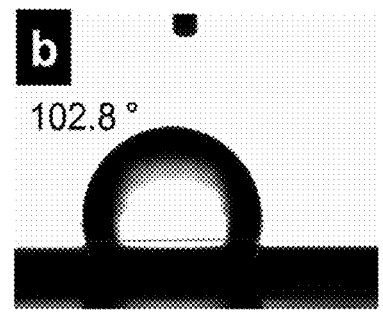
Figure 9C:
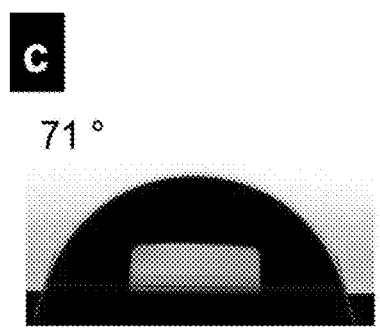
Figure 9D:
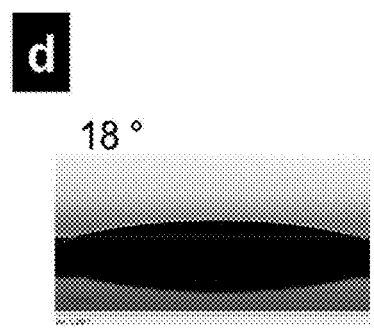
Figure 10B:
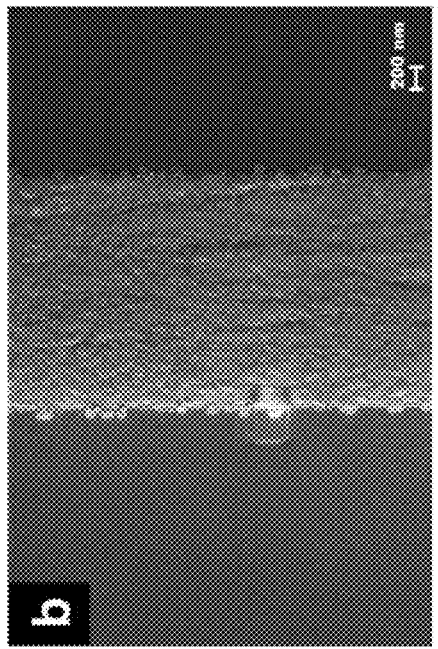
FIGS. 10A-10D show top-viewed SEM micrographs of a damascene template after SWNT assembly for various applied potentials.
Figure 10D:
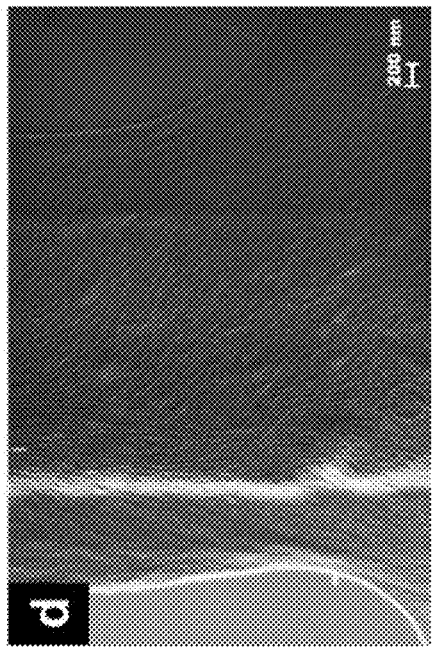
Figure 10A:
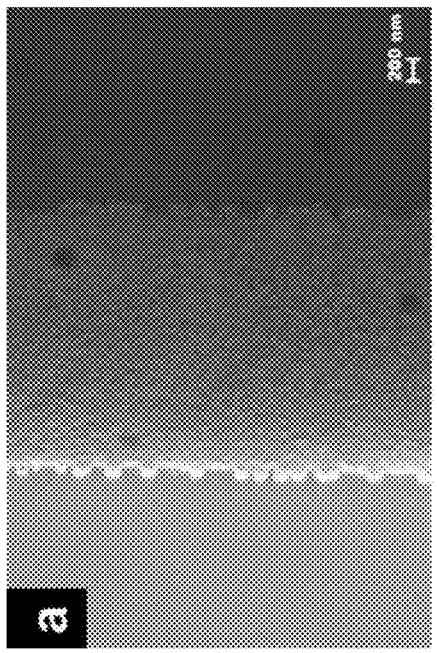
Figure 10C:
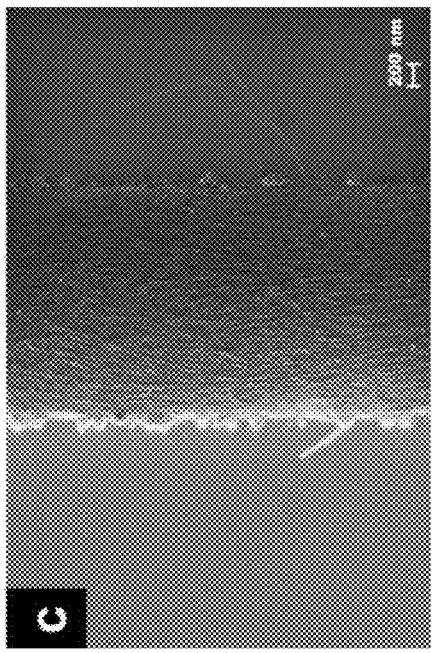

When electrophoretic assembly was carried out without an OTS SAM layer on the exposed surfaces of the second insulating layer, the nanoelements assembled everywhere including the insulator region as well as the conductor region (electrode). Without the OTS SAM layer, the surface energies of the insulator and the electrode are approximately the same as shown in FIG. 8A. When the potential is applied to the metal sheet underneath the insulator, the potential drop across the insulator is insufficient to prevent nanoelement assembly, and hence the nanoelements assembled on the insulator, decreasing the selectivity of the assembly result. A typical result for nanoparticle and SWNT assembly without an OTS SAM layer is shown in FIG. 8B.

The OTS SAM layer is applied to the damascene template using a wet chemical method. During this process an OTS SAM layer also can form on the metal electrodes and it can inhibit nanoelements from being assembled on them. In order to remove the OTS SAM layer selectively from the metal electrode, a chemical treatment with "piranha solution" was performed on the damascene template. The piranha treatment removed only the OTS SAM that was present on the metal electrodes and left the monolayer on the insulator unaffected. This was verified through contact angle measurements as shown in FIGS. 9A-9D before and after piranha treatment following OTS SAM layer deposition on the damascene template.

SWNTs used for assembly have terminal carboxylic acid groups due to their purification process. When suspended in deionized water, these carboxylic acid groups impart a negative charge to the SWNTs at sufficiently high pH. The electrophoretic force on the nanoelements due to an applied potential is directly proportional to the charge on the nanoelements and the electric field strength. When the applied voltage is increased, the electrophoretic force increases proportionally, resulting in increased amount of nanoelements assembled on the metal electrodes. FIGS. 9A-9D clearly show the significant effect of voltage on SWNT assembly. It can be seen from these results that assembly of SWNTs on the electrodes started between 1.5 V and 2 V. Beyond a critical value of the applied potential, the barrier introduced by $SiO_2$ fails, and nanoelements can assemble on the insulator surfaces as shown in FIGS. 10A-10D.

The capillary force acting on assembled nanoelements during their withdrawal from the suspension after assembly plays a crucial role on the adhesion of the nanoelements to the metal electrodes on the damascene template. For higher withdrawal speeds the removal moment acting on the nanoelements due to the capillary force would be larger, resulting in removal of the nanoelements. For a given type of nanoelement and applied potential the withdrawal speed needs to be adjusted, and can be characterized as illustrated in FIGS. 11A-11D. The adhesion force can be further improved by keeping the applied potential on. In all of these experimental results shown herein, the potential was kept on during the template withdrawal process.

Failure of the assembly and transfer process using damascene templates after several assembly and transfer cycles would be expected if the OTS SAM layer deteriorates on the insulator surfaces. If the OTS SAM on the insulator deteriorates then nanoelements can assemble on the insulator, resulting in low yield. To test the versatility and robustness of the damascene templates, the contact angle of the insulator surface was measured after each assembly and transfer cycle, and it is plotted in FIG. 12. Extrapolation of these results based on the assumption that the OTS SAM layer deteriorates at the same rate in subsequent assembly and transfer cycles leads to the estimate that the contact angle would reach a value of 70° after 140 cycles while it would reach a value of 50° at about 250 cycles. The contact angle of the metal electrode would also increase as a function of the number of cycles, and will eventually saturate. If one assumes the saturated contact angle value of 50° then the life cycle for a single coat of OTS SAM layer would be about 250 cycles. When the OTS SAM layer has deteriorated, another layer of OTS SAM layer can be added to the template, and it can be reused again for assembly and transfer.

The temperature applied to the substrates during the transfer process has an important effect on the transfer efficiency. The transfer process temperature preferably is close to that of the glass transition temperature of the polymer that makes up the receiving substrate. This is demonstrated in FIGS. 13A-13C. From the figure it is clear that when the process temperature is raised beyond the Tg for PEN (155° C.) the assembled nanoelements are transferred completely, achieving essentially 100% transfer yield.

Figure 14:
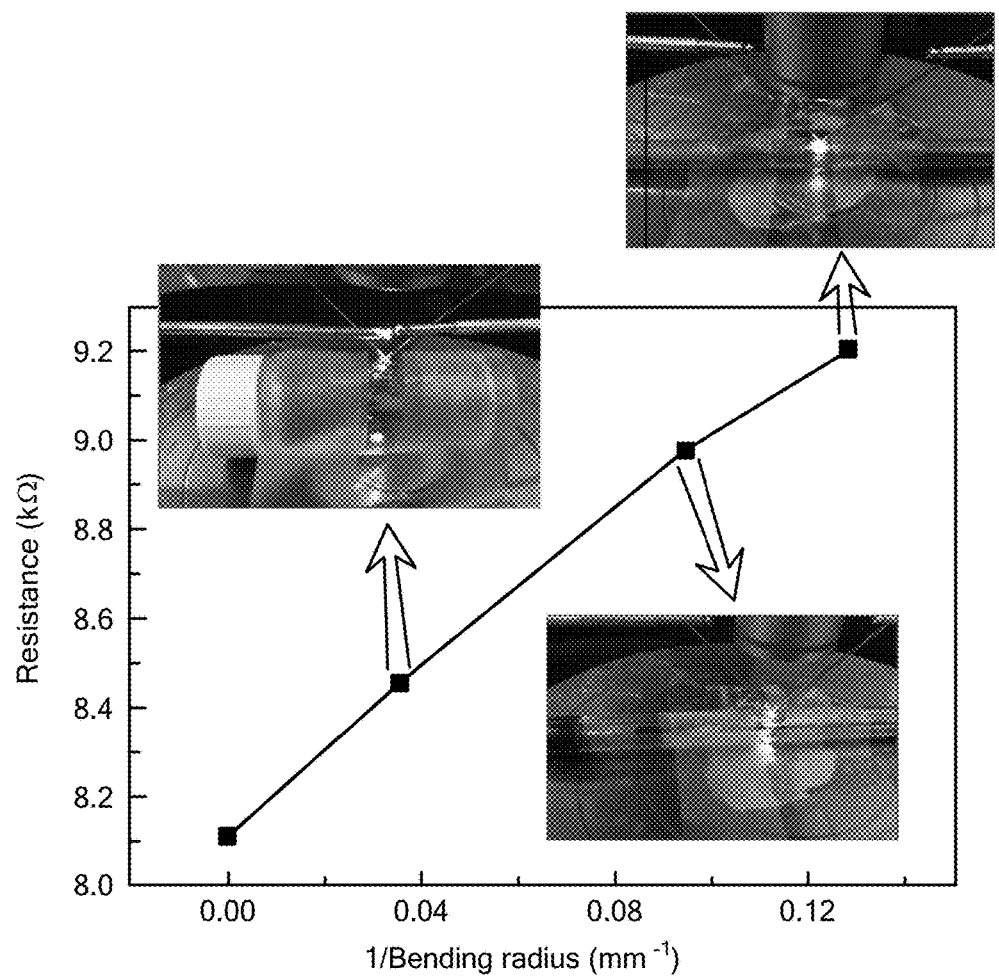
FIG. 14 shows a plot of the resistance measured as function of various bending radii. The inset shows optical images of the experimental setup used to measure the electrical properties at the desired bending radius.

The flexible recipient substrate with transferred nanoelements was subjected to a bending test. Cylindrical objects such as those shown in the inset of FIG. 14 were used for the bending test. The PEN film with transferred SWNTs and deposited electrodes was taped to the circumference of the cylindrical object and resistance measurements were taken in the bent state. The results are shown in FIG. 14.

As used herein, "consisting essentially of" does not exclude materials or steps that do not materially affect the basic and novel characteristics of the claim. Any recitation herein of the term "comprising", particularly in a description of components of a composition or in a description of elements of a device, can be exchanged with "consisting essentially of" or "consisting of".

While the present invention has been described in conjunction with certain preferred embodiments, one of ordinary skill, after reading the foregoing specification, will be able to effect various changes, substitutions of equivalents, and other alterations to the compositions and methods set forth herein.

REFERENCES

[1] T. Kraus, L. Malaquin, H. Schmid, W. Riess, N. D. Spencer, H. Wolf, Nature nanotechnology 2007, 2, 570.
[2] C. Yilmaz, T. H. Kim, S. Somu, A. A. Busnaina, Nanotechnology, IEEE Transactions on 2010, 9, 653.
[3] R. Krupke, F. Hennrich, H. Weber, M. Kappes, H. Löhneysen, Nano letters 2003, 3, 1019.
[4] P. Maury, M. Escalante, D. N. Reinhoudt, J. Huskens, Advanced Materials 2005, 17, 2718.
[5] Y. Xia, Y. Yin, Y. Lu, J. McLellan, Advanced Functional Materials 2003, 13, 907.
[6] L. Jaber-Ansari, M. G. Hahm, S. Somu, Y. E. Sanz, A. Busnaina, Y. J. Jung, Journal of the American Chemical Society 2008, 131, 804.
[7] X. Xiong, P. Makaram, A. Busnaina, K. Bakhtari, S. Somu, N. McGruer, J. Park, Applied physics letters 2006, 89, 193108.
[8] R. C. Bailey, K. J. Stevenson, J. T. Hupp, Advanced Materials 2000, 12, 1930.
[9] Q. Zhang, T. Xu, D. Butterfield, M. J. Misner, Du Yoel Ryu, T. Emrick, T. P. Russell, Nano letters 2005, 5, 357.
[10] E. Kumacheva, R. K. Golding, M. Allard, E. H. Sargent, Advanced Materials 2002, 14, 221.
[11] B. Li, H. Y. Jung, H. Wang, Y. L. Kim, T. Kim, M. G. Hahm, A. Busnaina, M. Upmanyu, Y. J. Jung, Advanced Functional Materials 2011, 21, 1810.
[12] J. H. Ahn, H. S. Kim, K. J. Lee, S. Jeon, S. J. Kang, Y. Sun, R. G. Nuzzo, J. A. Rogers, science 2006, 314, 1754.
[13] Y. Sun, H. H. Wang, Advanced Materials 2007, 19, 2818.
[14] D. Lee, T. Cui, Biosensors and Bioelectronics 2010, 25, 2259.
[15] B. Li, M. G. Hahm, Y. L. Kim, H. Y. Jung, S. Kar, Y. J. Jung, ACS nano 2011, 5, 4826.
[16] M. A. Meitl, Z. T. Zhu, V. Kumar, K. J. Lee, X. Feng, Y. Y. Huang, I. Adesida, R. G. Nuzzo, J. A. Rogers, Nature Materials 2005, 5, 33.
[17] F. N. Ishikawa, H. Chang, K. Ryu, P. Chen, A. Badmaev, L. Gomez De Arco, G. Shen, C. Zhou, ACS nano 2008, 3, 73.
[18] D. Hines, V. Ballarotto, E. Williams, Y. Shao, S. Solin, Journal of applied physics 2007, 101, 024503.
[19] T. Tsai, C. Lee, N. Tai, W. Tuan, Applied physics letters 2009, 95, 013107.
[20] T. Bibby, K. Holland, Journal of electronic materials 1998, 27, 1073.
[21] S. Siavoshi, C. Yilmaz, S. Somu, T. Musacchio, J. R. Upponi, V. P. Torchilin, A. Busnaina, Langmuir 2011, 27, 7301.
[22] E. Artukovic, M. Kaempgen, D. Hecht, S. Roth, G. Grüner, Nano letters 2005, 5, 757.
[23] L. Hu, D. Hecht, G. Grüner, Nano letters 2004, 4, 2513.
[24] M. Fuhrer, J. Nygård, L. Shih, M. Forero, Y. G. Yoon, H. J. Choi, J. Ihm, S. G. Louie, A. Zettl, P. L. McEuen, science 2000, 288, 494.

[25] N. Inagaki, Plasma surface modification and plasma polymerization, CRC, 1996.
[26] E. Liston, L. Martinu, M. Wertheimer, Journal of adhesion science and technology 1993, 7, 1091.

The invention claimed is:

1. A method of assembling and transferring a two-dimensional patterned assembly of nanoelements onto a flexible polymer substrate, the method comprising the steps of:
   (a) providing a nanoelement transfer system and a liquid suspension of nanoelements, the nanoelement transfer system comprising
      (i) a nanoelement assembly device for creating a patterned assembly of nanoelements;
      (ii) a thermally regulated imprint device for applying pressure between the damascene template and a flexible polymer substrate at a selected temperature above ambient temperature for transfer of said patterned assembly of nanoelements onto said flexible polymer substrate; and
      (iii) a damascene template comprising
         a substantially planar substrate;
         a first insulating layer disposed on a surface of the substrate;
         an optional adhesion layer disposed on a surface of the first insulating layer opposite the substrate;
         a conductive metal layer disposed on a surface of the adhesion layer opposite the first insulating layer, or disposed on a surface of the first insulating layer opposite the substrate if the adhesion layer is absent;
         a second insulating layer disposed on a surface of the conductive metal layer opposite the adhesion layer, or opposite the first insulating layer if the adhesion layer is absent; and
         a hydrophobic coating selectively disposed on exposed surfaces of the second insulating layer opposite the conductive metal layer;
         wherein the conductive metal layer is continuous across at least one region of the substrate, and within said region the conductive metal layer has a two-dimensional microscale or nanoscale pattern of raised features that interrupt the second insulating layer;
         wherein the second insulating layer substantially fills the spaces between said raised features; and
         wherein exposed surfaces of the raised features and the exposed surfaces of the second insulating layer are essentially coplanar;
   (b) submerging the damascene template in the liquid suspension of nanoelements;
   (c) applying a voltage between the conductive metal layer of the submerged damascene template and a counter electrode in the liquid suspension, whereby nanoelements from the suspension are assembled onto the exposed surfaces of the raised features of the conductive metal layer of the damascene template and not onto the exposed surfaces of the second insulating layer of the damascene template, thereby forming a patterned assembly of nanoelements on a surface of the damascene template;
   (d) withdrawing the damascene template and attached patterned assembly of nanoelements from the liquid suspension while continuing to apply voltage between the conductive metal layer of a submerged portion of the damascene template and the counter electrode;
   (e) drying the withdrawn damascene template; and
   (f) contacting the patterned assembly of nanoelements attached to the damascene template with the flexible polymer substrate and applying pressure and heat using the thermally regulated imprint device, whereby the patterned assembly of nanoelements is transferred onto the flexible polymer substrate; wherein the contacting is performed at a temperature above the glass transition temperature of the flexible polymer substrate.

2. The method of claim 1, wherein during steps (c) and (d) the conductive metal layer of the damascene template is positive, the counter electrode is negative, and the pH of the liquid suspension is adjusted such that the nanoelements have a negative charge.

3. The method of claim 1, wherein during steps (c) and (d) the conductive metal layer of the damascene template is negative, the counter electrode is positive, and the pH of the liquid suspension is adjusted such that the nanoelements have a positive charge.

4. The method of claim 1, wherein the voltage applied in steps (c) and (d) is sufficiently high to assemble the nanoelements from the suspension across essentially the entire exposed surface of the raised features of the conductive metal layer of the submerged damascene template.

5. The method of claim 1, wherein a speed of withdrawing the damascene template in step (d) is sufficiently slow to retain the attached patterned assembly of nanoelements on the surface of the raised features of the conductive metal layer of the damascene template through the withdrawal process.

6. The method of claim 1, wherein the voltage in steps (c) and (d) is in the range from 1.5 to 7 V and a speed of withdrawing in step (d) is in the range from 1 to 15 mm/min.

7. The method of claim 1, wherein steps (b) through (f) are repeated one or more times using the same damascene template and one or more additional flexible polymer substrates, whereby a plurality of patterned assemblies of nanoelements are transferred onto the additional flexible polymer substrates.

8. The method of claim 7, wherein steps (b) through (f) are repeated for a total of about 250 cycles and about 250 flexible polymer substrates are produced, each comprising a substantially identical patterned assembly of nanoelements.

9. The method of claim 8, wherein the hydrophobic coating of the damascene template is refreshed, followed by performing up to an additional 250 cycles of steps (b) through (f).

* * * * *